(12) United States Patent
Ledentsov et al.

(10) Patent No.: US 7,369,583 B2
(45) Date of Patent: May 6, 2008

(54) ELECTROOPTICALLY WAVELENGTH-TUNABLE RESONANT CAVITY OPTOELECTRONIC DEVICE FOR HIGH-SPEED DATA TRANSFER

(75) Inventors: Nikolai Ledentsov, Berlin (DE); Vitaly Shchukin, Berlin (DE)

(73) Assignee: Innolume GmbH, Dortmund (DE)

( * ) Notice: Subject to any disclaimer, the term of this patent is extended or adjusted under 35 U.S.C. 154(b) by 328 days.

(21) Appl. No.: 11/144,482

(22) Filed: Jun. 2, 2005

(65) Prior Publication Data

US 2005/0271092 A1    Dec. 8, 2005

Related U.S. Application Data

(60) Provisional application No. 60/577,537, filed on Jun. 7, 2004.

(51) Int. Cl.
 *H01S 3/10* (2006.01)
(52) U.S. Cl. .................. 372/20; 372/102; 372/106
(58) Field of Classification Search .......... 372/20, 372/21, 26, 29.01, 29.014, 29.016, 38.06, 372/43.01, 44.01, 50.1, 50.11, 68, 70, 96, 372/97
See application file for complete search history.

(56) References Cited

U.S. PATENT DOCUMENTS

| 3,760,292 A |   | 9/1973  | Kogelnik et al. ......... 331/94.5 |
|-------------|---|---------|------------------------------------|
| 4,740,987 A |   | 4/1988  | McCall, Jr. et al. .......... 372/96 |
| 5,264,715 A |   | 11/1993 | Guenter et al. ............... 257/98 |
| 5,519,721 A | * | 5/1996  | Takano ................. 372/46.012 |
| 5,574,738 A |   | 11/1996 | Morgan ....................... 372/28 |
| 5,757,837 A |   | 5/1998  | Lim et al. .................... 372/50 |
| 5,779,924 A |   | 7/1998  | Krames et al. ............... 216/24 |
| 5,973,336 A |   | 10/1999 | Hanke et al. ................. 257/94 |
| 5,976,905 A |   | 11/1999 | Cockerill et al. ............. 438/36 |
| 6,001,664 A |   | 12/1999 | Swirhun et al. .............. 438/31 |

(Continued)

FOREIGN PATENT DOCUMENTS

EP         0342953        11/1989

(Continued)

OTHER PUBLICATIONS

Fischer et al "Coupled resonator vertical-cavity laser diode" Applied Physics Letters, (Nov. 1999): 3020-3022.*

(Continued)

*Primary Examiner*—Leonardo Andujar
*Assistant Examiner*—Feifei Yeung-Lopez
(74) *Attorney, Agent, or Firm*—Brown & Michaels, PC

(57) ABSTRACT

A device contains at least one wavelength-tunable element controlled by an applied voltage and at least two resonant cavities, where the resonant wavelength of the tunable element is preferably elecrooptically tuned using the quantum confined Stark effect around the resonant wavelength of the other cavity or cavities, resulting in a modulated transmittance of the system. A light-emitting medium is preferably introduced into one of the cavities, permitting the optoelectronic device to work as an intensity-modulated light-emitting diode or diode laser by applying an injection current. The device preferably contains at least three electric contacts to apply a forward or a reverse bias and may operate as a vertical cavity surface emitting light-emitter or modulator or as a tilted cavity light emitter or modulator. Adding a few modulator sections enables applications in semiconductor optical amplifiers, frequency converters or lock-in optical amplifiers.

20 Claims, 10 Drawing Sheets

U.S. PATENT DOCUMENTS

| | | | |
|---|---|---|---|
| 6,026,108 A * | 2/2000 | Lim et al. ............... | 372/50.11 |
| 6,154,480 A | 11/2000 | Magnusson et al. .......... | 372/96 |
| 6,160,834 A | 12/2000 | Scott ........................ | 372/96 |
| 6,285,704 B1 | 9/2001 | Kullander-Sjoberg et al. ... | 372/96 |
| 6,363,093 B1 | 3/2002 | Glance ...................... | 372/50.1 |
| 6,392,256 B1 | 5/2002 | Scott et al. ................ | 257/184 |
| 6,396,083 B1 | 5/2002 | Ortiz et al. ................ | 257/94 |
| 6,455,340 B1 | 9/2002 | Chua et al. ................ | 438/31 |
| 6,611,539 B2 | 8/2003 | Ledentsov et al. ............ | 372/20 |
| 6,643,305 B2 | 11/2003 | Bewley et al. ............... | 372/45 |
| 2002/0186726 A1 * | 12/2002 | Ledentsov et al. ............ | 372/20 |
| 2003/0152120 A1 | 8/2003 | Ledentsov et al. ............ | 372/45 |
| 2003/0206741 A1 | 11/2003 | Ledentsov et al. ............ | 398/79 |
| 2005/0040410 A1 | 2/2005 | Ledentsov et al. ............ | 257/79 |

FOREIGN PATENT DOCUMENTS

| | | |
|---|---|---|
| EP | 0635893 | 1/1999 |
| GB | 2215075 | 9/1989 |
| JP | 06-314846 | 8/1994 |
| JP | 2003-121637 | 4/2003 |

OTHER PUBLICATIONS

Woodward "Sequential Vs. Coherent Tunneling in Double Barrier Diodes Investigated by Differential Absorption Spectroscopy" IEEE (1990): 13.7.1-13.7.4.*

Gupta, Mool C. Handbook of Photonics. Florida: Boca Raton, 1996.*

Borges, Ric. "Gallium nitride electronic devices for high-power wireless applications" <http://www.rfdesign.com>.*

Fischer et al "Coupled resonator vertical-cavity laser diode" American Institute of Physics,(Nov. 1999):3020-3022.*

Borges "Gallium nitride electronic devices for high-power wireless applications" RF semiconductors, Sep. 2001 <www.rfdesign.com.*

H.C. Casey, Jr. and M.B. Panish, "Heterostructure Lasers", Part A, Academic Press, New York, 1978, pp. 34-57, 165-167.

A. Yariv, P. Yeh, "Optical Waves in Crystals. Propagation and Control of Laser Radiation", Wiley 1984.

Annual Report of Heinrich Hertz Institute, 2003, http://www.hhi.fraunhofer.de/english/.

V. Bardinal, R. Legros, and C. Fontaińe, "In situ measurement of AIAs and GaAs refractive index dispersion at epitaxial growth temperature", *Applied Physics Letters*, vol. 67 (2), pp. 244-246 (1995).

D.E.Aspnes (*Physical Review*, B14 (12), pp. 5331-5343 (1976)).

Ledentsov, Nikolai N., "Nanostructures How Nature Does It", Educational Centre at IOFFE Institute Invited Lecture. Oct. 13, 2000. Http://web.edu.ioffe.ru/lectures/index_en.html.

Deppe, D.G., 2000; Optoelectronic Properties of Semiconductors and Superlattices:, vol. 10, Vertical-Cavity Surface-Emitting Lasers: Technology and Applications; pp. 1-61.

Meade, R.D. et al; 1993; "Accurate theoretical analysis of photonic band-gap materials"; Physical Review B 48:11, pp. 8434-8437.

Born, M. et al; 1980; "Principles of Optics"; 6th edition, Pergamon Press, pp. 1-70.

N.N. Ledentsov and V.A. Shchukin. "Novel concepts for Injection Lasers" Opt. Eng. vol. 41, No. 12, 2002, p. 3193-3203.

N.N. Ledentsov and V.A. Shchukin. "Novel Approaches to Semiconductor Lasers" Proceedings of SPIE, vol. 4905, 2002, p. 222-234.

A.G. Weber, Wu Ronghan and D. Bimberg "High-frequency response of p-substrate buried crescent InGaAsP lasers" J. Appl. Phys. 68, 2499 (1990).

D. Tauber, G. Wang, R. S. Geds, J. E. Bowers, and L. A. Coldren, "70 GHz relaxation oscillation in vertical cavity surface emitting laser," *IEEE Trans. Electron. Devices*, 39, p. 2652 (1992).

D. Tauber , G. Wang, R.S. Geds, J.E. Bowers, L.A. Coldren, "70 GHz relaxation oscillation in a vertical cavity surface emitting laser" *Device Research Conference, 1992. Digest. 50th Annual*, Jun. 22-24, 1992 pp. 0_81-0_82.

S. M. Kim, Y. Wang, M. Keever, and J. S. Harris "High-Frequency Modulation Characteristics of 1.3- m InGaAs Quantum Dot Lasers" *IEEE Phot. Technol. Lett.* 16, pp. 377-379, (2004).

S. Weisser, E.C. Larkins, K. Czotscher, W. Benz, J. Daleiden, I. Esquivias, J. Fleissner, J.D. Ralston, B. Romero, R.E. Sah, A. Schonfelder, J. Rosenzweig, "Damping-limited modulation bandwidths up to 40 GHz in undoped short-cavity In0.35Ga0.65As-GaAs multiple-quantum-well lasers" IEEE Photon. Technol. Lett. 8, pp. 608-610 (1996).

T. Yoshie, O. Painter, A. Scherer, D. Huffaker, D. Deppe, "Photonic crystal defect microcavities with indium arsenide quantum dots" Lasers and Electro-Optics Society 2000 Annual Meeting. LEOS 2000. 13th Annual Meeting. IEEE , vol. 2, Nov. 13-16, 2000 pp. 415-416 vol. 2.

N. Ledentsov, D. Bimberg, V. M. Ustinov, M V Maximov, Zh. I. Alferov, V. P. Kalosha and J. A. Lott "Interconnection between gain spectrum and cavity mode in a quantum dot vertical cavity laser" *Semicond. Sci. Technol.* 14, pp. 99-102 (1999).

R. King "2D VCSEL Arrays for Chip-Level Optical Interconnects" Annual report 1999, Dept. of Optoelectronics, University of Ulm.

A. N. Al-Omari, K. L. Lear, "Polyimide-planarized vertical-cavity surface-emitting lasers with 17.0-GHz bandwidth" *IEEE Photon. Technol. Lett.*, vol. 16, pp. 969-971 (2004).

P. Pepeljugoski, D. Kuchta.; Y. Kwark, P. Pleunis, G. Kuyt, 15.6-Gb/s transmission over 1 km of next generation multimode fiber, *IEEE Photon. Technol. Lett.* 14 pp. 717-719 (2002).

D.M. Kuchta, P. Pepeljugoski, Y. Kwark, "VCSEL modulation at 20 Gb/s over 200 m of multimode fiber using a 3.3 V SiGe laser driver IC" *Advanced Semiconductor Lasers and Applicants/Untraviolet and Blue Lasers and Their Applications/Ultralong Haul DWDM Transmission and Networking/WDM Components, 2001 Digest of the LEOS Summer Topical Meetings*, Jul. 30-Aug. 1, 2001 pp. 2 pp.

Won-Jin Choi, A.E. Bond, Jongwoo Kim, Jiaming Zhang, R. Jambunathan, H. Foulk, S. O'Brien, J. Van Norman, D. Vandergrift, C. Wanamaker, J. Shakespeare, He Cao "Low insertion loss and low dispersion penalty InGaAsP quantum-well high-speed electroabsorption modulator for 40-Gb/s very-short-reach, long-reach, and long-haul applications" *Journal of Lightwave Technology* 20, pp. 2052-2056 (2002).

N. Mineo, K. Yamada, K. Nakamura, S. Sakai, and T. Ushikubo, "60-GHz band electroabsorption modulator module," in *Proc. OFC 1998*, ThH4.

F. Devaux. P. Bordes, A. Ougazzaden, M. Carre, and F. Huff, "Experimental optimization of MQW electroabsorption modulators with up to 40GHz bandwidths," *Electron. Lett.*, vol. 30, pp. 1347-1348 (1994).

A.H. Steinbach, I. Penn, , N. Chokshi D. Martin, , K. Slomkowsk, W. Baun, N. Agrawal, R. Ben-Michael, M.A. Itzler, "Equivalent circuit modelling of p-i-n photodiodes for 40 Gb/s receivers" Lasers and Electro-Optics Society, 2002. LEOS 2002. The 15th Annual Meeting of the IEEE , vol. 2, Nov. 10-14, 2002, pp. 486-487 vol. 2.

E. Alekseev, D. Pavlidis, V. Ziegler, M.; Berg, J. Dickmann "77 GHz high-isolation coplanar transmit-receive switch using InGaAs/InP PIN diodes" Gallium Arsenide Integrated Circuit (GaAs IC) Symposium, 1998. Technical Digest 1998., 20th Annual Meeting, Nov. 1-4, 1998. pp. 177-180.

Y. Muramoto, T. Ishibashi "InP/InGaAs pin photodiode structure maximising bandwidth and efficiency" *Electronics Letters* 39, 1749-1750 (2003).

A. Umbach, T. Engel, H.-G. Bach, S. van Waasen, E. Droge, A. Strittmatter, W. Ebert, W. Passenberg, R. Steingruber, W. Schlaak, G.G. Mekonnen, G. Unterborsch, D. Bimberg, "Technology of InP-based 1.55- m ultrafast OEMMICs: 40-Gbit/s broad-band and 38/60-GHz narrow-band photoreceivers" IEEE J. Quantum Electron. 35, pp. 1024-1031 (1999).

I. Galbraith, B. Ryvkin "Empirical determination of the electroabsorption coefficient in semiconductors", J. Appl. Phys. 74, 4145 (1993).

D. S. Chelma et al. "Room Temperature Excitonic Nonlinear Absorption and Refraction in GaAs/AIGaAs Multiple Quantum Well Structures" IEEE Journal of Quantum Electronics. Vo. QE-20, No. 3, p. 265-275 1984.

J.E. Zucker, T.L. Hendrickson, and C.A. Burrus, "Electro-optic phase modulation in GaAs/AlGaAs quantum well waveguides", Applied Physics Letters, vol. 52 (12), pp. 945-947 (1988)).

J.S. Weiner et al., "Quadratic electro-optic effect due to the quantum-confined Stark effect in quantum wells", Applied Physics Letters, vol. 50 (13), pp. 842-844 (1987).

J.E. Zucker et al. "Quaternary quantum wells for electro-optic intensity and phase modulation at 1.3 and 1.55 μm", Applied Physics Letters, vol. 54 (1), pp. 10-12 (1989).

M.P. Earnshow and D.W.E. Allshop, "Electrooptic Effects in GaAs—AlGaAs Narrow Coupled Quantum Wells", IEEE Journal of Quantum Electronics, vol. 37 (7), pp. 897-904. (2001).

M.P. Earnshow and D.W.E. Allshop, correction to "Electrooptic Effects in GaAs—AlGaAs Narrow Coupled Quantum Wells", IEEE Journal of Quantum Electronics, pp. vol. 37 (8), p. 1103 (2001).

L. Chen, K.C. Rajkumar, and A. Madhukar "Optical Absorption and Modulation Behavior of Strained InxGa1-xAs/GaAs (100) ($\chi \leq$ 0.25) multiple quantum well structure grown via molecular beam epitaxy", Applied Physics Letters, vol. 57 (23), pp. 2478-2480 (1990).

Feng et al. " Exciton energies as a function of electric field: Confined quantum Stark effect", Physical Review B, vol. 48 (3), pp. 1963-1966 (1993)).

Lengyel et al, "A Semi-Empirical Model for Electroabsorption in GAAS/ALGaAs Multiple Quantum Well Modulator Structures." IEEE Journal of Quantum Electronics, vol. 26, No. 2, Feb. 1990, p. 296-304.

Batty et al., "Internal Biasing by -Doping for Low Voltage, High-Bandwidth Quantum-Well Optical Modulators." IEEE Photonics Technology Letters, vol. 7, No. 6, Jun. 1995, pp. 635-637.

Kalliteevskii, M. A., "Coupled Vertical Microcavities" Technical Physics Letters, American Institute of Physics, vol. 23, No. 2, Feb. 1997.

Chen, Quoqiang et al. "Angular Filtering of Spatial Modes in a Vertical-Cavity Surface-Emitting Laser by a Fabry-Perot etalon" Applied Physics Letters, American Institute of Physics, vol. 71, No. 8, Feb. 1999.

Pezeshki B et al., "Multiple Wavelength Light Source using an Asymmetric Waveguide Coupler," Applied Physics Letters, American Institute of Physics. New York, US, vol. 65, No. 2, Jul. 11, 1994, pp. 138-140.

Pezeshki B. et al., "A Gratingless Wavelength Stabilized Semiconductor Laser," Applied Physics Letters, American Institute of Physics. New York, US, vol. 69, No. 19, Nov. 4, 1996, pp. 2807-2809.

Bardia Pezeshki et al., "Vertical Cavity Devices as Wavelength Selective Waveguides," Journal of Lightwave Technology, IEEE. New York, US, vol. 12, No. 10, Oct. 1, 1994, pp. 1791-1801.

Fischer, A. J. et al. "Coupled Resonator Vertical-Cavity Laser Diode" American Institute of Physics, Applied Physics Letters, vol. 75, No. 19, 1999.

Ledentsov, N.N, "Long-Wavelength Quantum-Dot Lasers on GaAs Substrates: From Media to Device Concepts" IEEE Journal of Selected Topics in Quantum Electronics, vol. 8, No. 3, 2002 1015-1024.

* cited by examiner

ELECTROOPTICALLY WAVELENGTH-TUNABLE RESONANT CAVITY OPTOELECTRONIC DEVICE FOR HIGH-SPEED DATA TRANSFER

REFERENCE TO RELATED APPLICATIONS

This application claims an invention which was disclosed in Provisional Application No. 60/577,537, filed Jun. 7, 2004, entitled "ELECTROOPTICALLY WAVELENGTH-TUNABLE RESONANT CAVITY OPTOELECTRONIC DEVICE FOR HIGH-SPEED DATA TRANSFER". The benefit under 35 USC §119(e) of the United States provisional application is hereby claimed, and the aforementioned application is hereby incorporated herein by reference.

BACKGROUND OF THE INVENTION

1. Field of the Invention

The invention pertains to the field of semiconductor devices. More particularly, the invention pertains to ultra-high-speed optoelectronic devices.

2. Description of Related Art

High-speed optoelectronic devices are broadly applied in modem datacommunication and telecommunication systems.

These devices can be separated into two categories: those directly modulated by injection of current into the gain region, and those externally modulated. Direct-modulation offers the advantage of low cost but requires very high photon densities in the resonant cavity. For, example, edge-emitting lasers operating at 40 Gb/s have been reported.

The intrinsic speed is defined by the so-called "−3 dB" bandwidth, which is roughly proportional to the relaxation-oscillation frequency:

$$f_r = \frac{1}{2\pi}\sqrt{\frac{g_n p_0}{\tau_p}}, \quad (1)$$

where $g_n$ denotes the differential gain, $p_0$ is the average photon density in the cavity, and $\tau_p$ is the cavity photon lifetime.

A first way to increase the laser bandwidth is to increase the pump current density thereby increasing the photon population of the cavity, for example, by reducing the surface area of the device for the same total current. Under pulsed excitation relaxation, an oscillation frequency as high as 70 GHz has been demonstrated in a pulsed regime at room temperature under applied voltage of 15 volts. Continuous wave (CW) operation at very high current and dissipated power densities was not possible. Commonly accepted limitations for all types of semiconductor laser diodes are at ~0.2 mW/μm$^2$ of thermal power per surface area for heat dissipation. The limiting optical power is close to ~1 mW/μm$^2$. Maximum current densities assuming 30% wall-plug efficiency are about ~2 mA/μm$^2$ or 20 kA/cm$^2$.

A second way to increase the laser bandwidth is to increase the differential gain by lowering the dimensionality of the active layer. Modification of the density of states provides two key advantages. First, differential efficiency and threshold current can be made temperature stable in a wide temperature range.

More importantly, converting from quantum wells (QWs) to quantum dots (QDs) enables edge emitting lasers to reach 10 Gb/s operation at current densities of ~1 kA/cm$^2$, where conventional InP quantum well devices of this spectral range just start to lase. The bandwidth increases approximately as a square root of current density. At a current density of approximately 20 kA/cm$^2$, a quantum dot laser has the potential to reach 40 Gbps direct modulation if parasitic temperature-related effects and gain saturation effects are avoided. A quantum well device approaches the same frequency at about 3-4 times higher current densities.

Doping the cavity simplifies carrier trapping into the active media and reduces radiative lifetime increasing differential gain.

Shifting the lasing photon energy beyond the bandedge of the semiconductor to the gain continuum is possible for distributed feedback (DFB) lasers and vertical cavity surface-emitting lasers (VCSELs). In VCSELs this approach is particularly attractive, enabling device operation in the range of high gain, while avoiding gain saturation effects within the low-gain tail states.

Another very powerful but less exploited approach addresses optical mode engineering in the VCSEL cavity. Many disadvantages of laser diodes originate from parasitic radiative modes, which cause enhanced radiative leakage, thus preventing quickly approaching a population inversion. The same modes cause effective depletion of the vertical cavity gain below threshold, once the device reaches the population inversion condition. These parasitic processes are most pronounced in the solutions aimed at high-speed operation; in p-doped active media and in cavities with the cavity dip shifted into the gain continuum, where parasitic radiative recombination and gain leakage are particularly strong.

To prevent this effect, a photonic crystal-confined VCSEL may be used. In this case, radiative and gain leakage are partly prohibited by lack of photon states in the photonic crystal surrounding the cavity. Thus parasitic radiative recombination and gain are prohibited. This approach enables practically thresholdless lasers. Once the stimulated emission is channeled in a single mode, much higher gain is possible.

A disadvantage of this approach is its much higher cost and precise processing tolerances, related, for example, to deep ion etching of the distributed Bragg reflector (DBR) layers. The effect of suppressed parasitic leakage may also be achieved by choosing a specific VCSEL design.

None of the approaches for high-speed operation in the prior art address problems of parasitic capacitance, inductance and resistance in VCSELs.

In spite of the fact that low threshold quantum well and quantum dot devices exist, parasitic capacitance, inductance and resistance in VCSELs limit their high-speed performance, even when intrinsic parameters (relaxation oscillations) indicate the possibility for a much faster bit rate.

It is difficult to reduce parasitics in VCSELs and still provide certain aperture sizes, certain thicknesses of the Bragg reflector regions, certain surface areas of the current pads and unavoidable high differential capacitance of the p-n junction under direct bias. Simultaneously approaching low threshold current, high frequency response, low power dissipation and high reliability is difficult for directly-modulated VCSELs.

The problem is usually addressed with careful optimization of the processing technology. The best bandwidth achieved in the prior art so far (17.0 GHz) was realized in a device operating at 4.5 mA with a 7 μm aperture (~12 kA/cm$^2$). Dissipated power was 8.1 mW.

Faster intrinsic modulation responses of the device (larger bandwidths at the same current density) add more flexibility to achieve necessary compromises to reduce the parasitic effects that hinder time response. Modulation bandwidth of 40 GHz has been demonstrated in GaAs-based edge-emitting lasers and no fundamental limitations for VCSELs exist. High-speed VCSELs are used in high-bit rate long-distance LAN networks based on multimode fibers. However, a principal limitation is that the device must be operated at high current densities to achieve high modulation speed. 40 Gb/s VCSELs have not yet been demonstrated.

In contrast, indirect modulation using elecropptic effects under reverse bias has long been known in ultrahigh-speed transmitters operating at 40-60 Gb/s. For example, a 40-Gb/s open eye diagram of the electroabsorption modulator after 700-km transmission has been demonstrated.

Once the need for direct modulation is abandoned, ultra-high-speed signal management becomes much easier. 60-100 GHz pin diode photodetectors using large mesa devices as well as other devices are known in the art.

U.S. Pat. No. 6,285,704, "FIELD MODULATED VERTICAL CAVITY SURFACE-EMITTING LASER WITH INTERNAL OPTICAL PUMPING", issued Sep. 4, 2001, proposes a photopumped VCSEL. This VCSEL may be modulated by using an external electrical field applied perpendicular to the active layer, employing the Stark-effect to deliberately change the bandgap of the active layer and hence move the emission wavelength into and out of resonance with the optical cavity formed between the top and bottom mirrors. The optical output is therefore modulated by the electrical field and not by injected carriers. However, as the active region of the device is under a continuous population inversion condition, applying a reverse bias to change the bandgap may cause dramatic photocurrent, depleting the photopumped active region.

U.S. Pat. No. 5,574,738, "MULTI-GIGAHERTZ FREQUENCY-MODULATED VERTICAL-CAVITY SURFACE EMITTING LASER", issued Nov. 12, 1996, discloses a saturable absorber contained within the VCSEL's distributed Bragg reflector, which may itself be adjusted during fabrication or in operation. Under controllable operating conditions, the saturable absorber, strategically sized and placed, forces the VCSEL to self-pulsate (in the GHz-regime) at rates related to the local intensity, absorption, lifetime, and carrier density of the saturable absorber. In one of the embodiments, efficiency of the saturable absorber may be controlled by the quantum-confined Stark effect. Mode-locked operation, however, is usually very sensitive to the conditions of the device operation and exists only in a relatively narrow range of carefully-optimized conditions.

U.S. Pat. No. 6,396,083, entitled "OPTICAL SEMICONDUCTOR DEVICE WITH RESONANT CAVITY TUNABLE IN WAVELENGTH, APPLICATION TO MODULATION OF LIGHT INTENSITY", issued May 28, 2002, discloses a device including a resonant cavity. The resonant cavity is delimited by two mirrors and at least one superlattice that is placed in the cavity and is formed from piezoelectric semiconducting layers. The device also includes means of injecting charge carriers into the superlattice. One disadvantage of this device is the necessity of using piezoelectric materials. The piezoelectric semiconducting layers are epitaxied on a $Cd_{0.88}Zn_{0.12}Te$ substrate and include a pattern composed of a layer of $Cd_{0.91}Mg_{0.09}Te$ and a layer $Cd_{0.88}Zn_{0.22}Te$, each 10 nm thick. This pattern is repeated about a hundred times. The device in this patent is a two-terminal device. The separation of carriers in a piezoelectric superlattice causes long depopulation times. Wavelength modulation and intensity modulation are always interconnected in this patent.

An electrooptic modulator based on the quantum confined Stark effect (QCSE) in a VCSEL was disclosed in U.S. Pat. No. 6,611,539, "WAVELENGTH-TUNABLE VERTICAL CAVITY SURFACE EMITTING LASER AND METHOD OF MAKING SAME" issued Aug. 26, 2003, by the inventors of the present invention and herein incorporated by reference. The device includes active media suitable for providing gain and enabling laser action of the device, and a position-dependent electrooptic modulator region. Applying the voltage to the modulator region results in a wavelength shift of the lasing wavelength. The absorption in the modulator region remains small. The device is especially applicable for ultrahigh-speed data transfer using wavelength-modulation.

U.S. Patent Publication 2003/0206741, entitled "INTELLIGENT WAVELENGTH DIVISION MULTIPLEXING SYSTEMS BASED ON ARRAYS OF WAVELENGTH TUNABLE LASERS AND WAVELENGTH TUNABLE RESONANT PHOTODETECTORS", published Nov. 6, 2003, by the inventors of the present invention and herein incorporated by reference, disclosed high-bit rate data transfer systems based on wavelength-to-intensity modulation conversion. In this approach, a wavelength-tunable VCSEL operates in concert with a wavelength-selective photodetector on the receiver side. Modulation of the VCSEL wavelength transforms into the photodetector current modulation.

There is a need in the art for an ultrafast way to modulate the intensity already at the exit of the device.

SUMMARY OF THE INVENTION

A device contains at least one wavelength-tunable element controlled by an applied voltage and at least two resonant cavities. The resonant wavelength of the tunable element is preferably elecrooptically tuned using the quantum confined Stark effect around the resonant wavelength of the other cavity or cavities, resulting in a modulated transmittance of the system. A light-emitting medium is preferably introduced in one of the cavities permitting the optoelectronic device to work as an intensity-modulated light-emitting diode or diode laser by applying an injection current. The device preferably contains at least three electric contacts to apply forward or reverse bias and may operate as a vertical cavity surface emitting light-emitter or modulator or as a tilted cavity light emitter or modulator. Adding additional modulator sections enables applications in semiconductor optical amplifiers, frequency converters or lock-in optical amplifiers.

DETAILED DESCRIPTION OF THE INVENTION

The present invention provides an ultrafast way to modulate the intensity already at the exit of an optoelectronic device.

Figure 1:
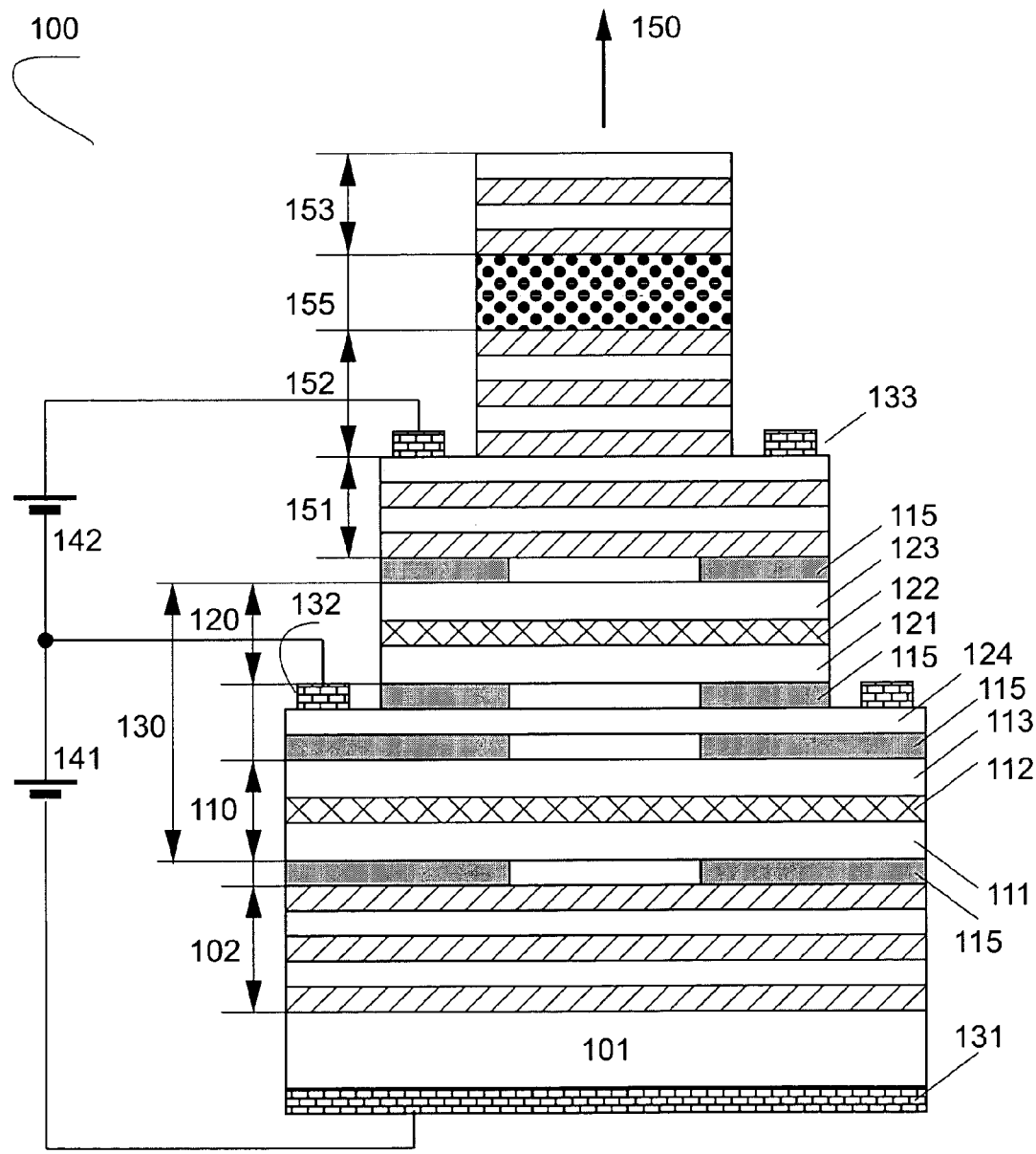
FIG. 1 shows a schematic diagram of an electronically wavelength-tunable vertical cavity surface emitting laser including a light generating element, a modulating element and a filter element, where the light generating element and the modulating element are placed in a single cavity, according to an embodiment of the present invention.

FIG. 1 shows schematically an electronically wavelength tunable vertical cavity surface emitting laser, where the modulation of the wavelength is transformed into the modulation of the intensity of the output laser light. The device 100 includes a substrate 101, a first distributed Bragg reflector 102, a cavity 130, a second distributed Bragg reflector 151, a third distributed Bragg reflector 152, a filter 155, and a fourth distributed Bragg reflector 153. The cavity 130 includes a light generating element 110, and a modulating element 120.

The part of the device 100, including the substrate 101, the first distributed Bragg reflector 102, the light generating element 110, the modulating element 120, and the second distributed Bragg reflector 151, is a wavelength tunable vertical cavity surface emitting laser as disclosed in U.S. Pat. No. 6,611,539. In addition, the device 100 includes a filter element 155.

The substrate 101 is preferably formed from any III-V semiconductor material or III-V semiconductor alloy, e.g. GaAs, InP, GaSb. GaAs or InP are preferably used depending on the desired emitted wavelength of laser radiation. Alternatively, sapphire, SiC or Si(111) may be used as substrates for GaN-based lasers, i.e. laser structures the layers of which are formed of GaN, AlN, InN, or alloys of these materials. The substrate 101 is doped by an n-type, or donor impurity. Possible donor impurities include, but are not limited to, S, Se, Te, and amphoteric impurities like Si, Ge, Sn where the latter are introduced under such technological conditions that they are incorporated predominantly into the cation sublattice and serve as donor impurities. Any substrate orientation including, but not limited to, (100), (110), (111), or a high Miller index substrate, may be used.

The first distributed Bragg reflector 102 preferably includes a periodic structure of layers, transparent for the generated laser light, having alternating high and low refractive indices and is n-doped. The layers are formed of the materials preferably lattice-matched or nearly lattice-matched to the substrate 101. In a GaAs-based device, the layers of the first distributed Bragg reflector are preferably formed of GaAs and GaAlAs, or of layers of GaAlAs with alternating Al content.

The light generating element 110 preferably includes an undoped or a weakly doped layer 111, an active region 112, and an undoped or weakly doped layer 113. Layers 111 and 113 are formed of materials, lattice-matched or nearly lattice-matched to the substrate 101, and transparent to the generated laser light.

The active region 112 is formed of any insertion or combinations of insertions, including a double heterostructure, a quantum well, an array of quantum wires, and arrays of quantum dots, or any combination thereof. The active region 112 generates light, when a forward bias 141 is applied.

For structures grown on a GaAs substrate, materials for the active region include, but are not limited to, GaAs, InGaAs, GaAsSb, GaAsP, GaAlAs, InGaAsN, and InGaAsNSb. For structures grown on sapphire, SiC, or Si(111), materials for the active region include, but are not limited to, InGaN, InGaAlN, and InGaAlNAs. For structures grown on InP, materials for the active region include, but are not limited to, InGaAs, InGaAlAs, InGaAsSb, InGaAsP, and InGaAsN.

A forward bias 141 is applied via a first contact 131 (an n-contact) and a second contact 132 (a p-contact). The contacts 131 and 132 are preferably formed from the multi-layered metal structures. The contact 131 is preferably formed from the structures including, but not limited to, the structure Ni—Au—Ge. The contact 132 is preferably formed from structures including, but not limited to, the structure Ti—Pt—Au.

The p-contact 132 is preferably mounted on a current spreading p-layer 124. The current spreading p-layer 124 is preferably formed of a material lattice-matched or nearly lattice-matched to the substrate 101, transparent to the generated laser light and p-doped, i.e. doped by an acceptor impurity. Possible acceptor impurities include, but are not limited to, Be, Mg, Zn, Cd, Pb, Mn and amphoteric impurities like Si, Ge, Sn where the latter are introduced under such technological conditions that they are incorporated predominantly into the anion sublattice and serve as acceptor impurities. The modulating element 120 includes a weakly p-doped or an undoped layer 121, a modulator region 122, and a weakly n-doped or an undoped layer 123. Layers 121 and 123 are preferably formed of any material, lattice-matched or nearly lattice-matched to the substrate and transparent to the generated laser light.

The modulator region 122 includes one or more quantum wells, one or more layers of quantum wires or quantum dots, or any combination thereof. In the particular embodiment of FIG. 1, the modulator 122 operates when a reverse bias 142 is applied. The operation of the modulator is based on the quantum confined Stark effect. By varying the bias 142, the electric field applied to the modulator is varied. Then the position of the optical absorption peak is shifted, due to the Stark effect. Due to Kramers-Kronig relationship between the real and imaginary parts of the dielectric function of the medium, the shift of the absorption peak results in a modulation of the refractive index of the modulator. The latter leads to a shift of the resonant wavelength of the cavity 130, and thus, to a shift of the wavelength of the generated laser light.

Reverse bias 142 is applied to the modulator via the second contact 132 (p-contact) and the third contact 133 (n-contact). The second distributed Bragg reflector 151 is preferably formed of a periodic structure of alternating layers having a high and a low refractive index. The layers are preferably formed of materials lattice-matched or nearly lattice-matched to a substrate, transparent to generated laser light and n-doped.

Current apertures 115 separate the first distributed Bragg reflector 102 from the light generating element 110, the light generating element 110 from the current spreading p-layer 124, the current spreading p-layer 124 from the modulator element 120, and the modulator element 120 from the second distributed Bragg reflector 151. The current apertures 115 are preferably formed by oxidation of AlAs layers of $Ga_{1-x}Al_xAs$ layers, where the Al content is preferably x>0.92, resulting in the formation of AlO or GaAlO dielectric apertures. In an alternative embodiment, the current apertures are formed by proton bombardment.

The part of the device sandwiched between the first contact 131 and the third contact 133 is a wavelength tunable vertical cavity surface emitting laser, as disclosed in U.S. Pat. No. 6,611,539.

The device 100 additionally includes a third distributed Bragg reflector 152, a filter element 155, and a fourth distributed Bragg reflector 153. The filter element 155 is formed such that it has a narrow spectral band of high transmission, whereas its transmission outside this narrow spectral region is low. As an example, the filter 155 is preferably formed by a resonant cavity sandwiched between two distributed Bragg reflectors. Laser light comes out 150 through the fourth distributed Bragg reflector 153.

In another embodiment of the present invention, the modulator region operates under a forward bias. Applying a forward bias results in an exciton bleaching effect, which further leads to a change in refractive index of the modulator region.

Figure 2:
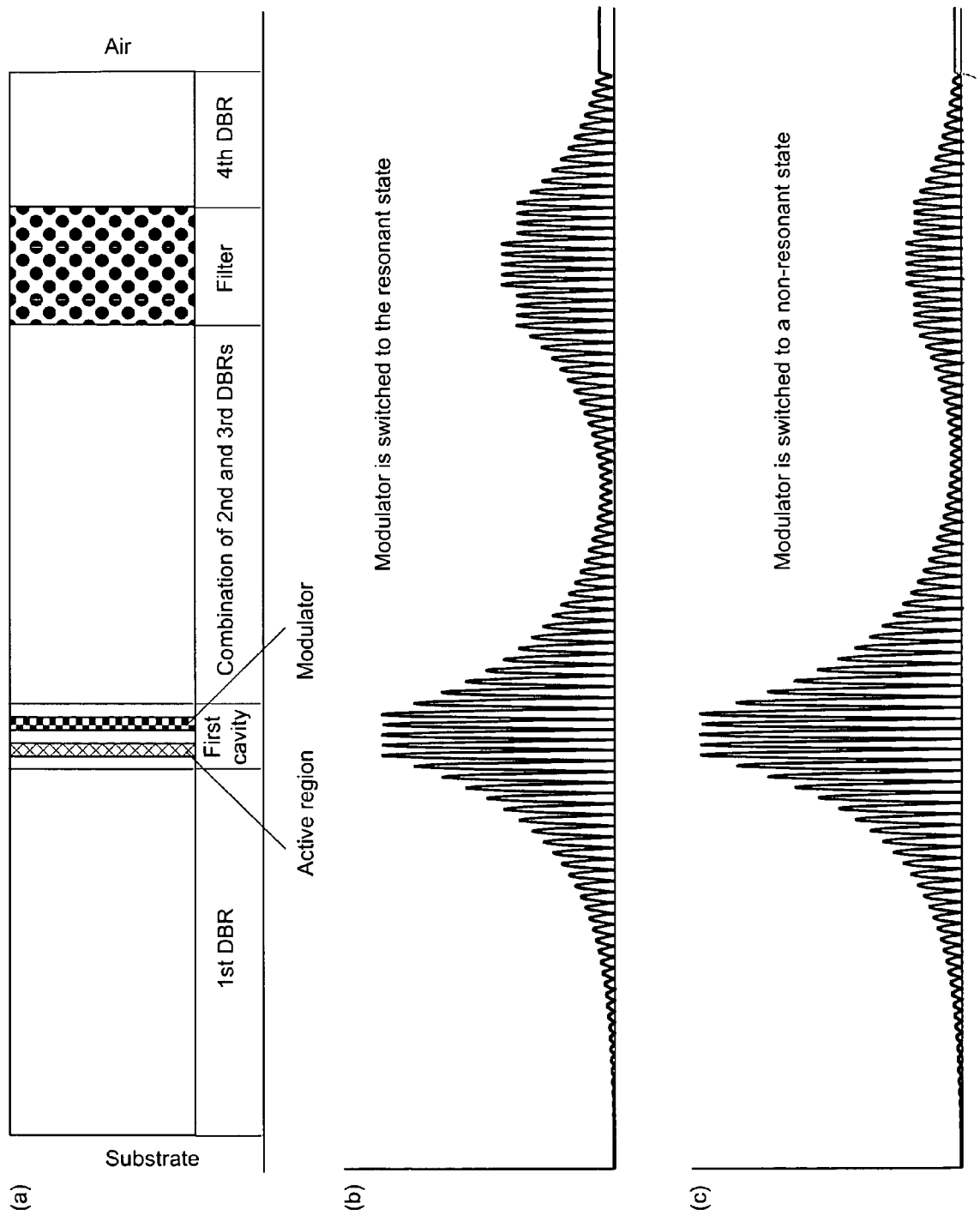
FIG. 2(a) shows a schematic diagram of the device of FIG. 1.
FIG. 2(b) shows a schematic diagram of the absolute value of the electric field strength profile of the laser optical mode of the device of FIG. 1 where the modulator is in the resonant state.
FIG. 2(c) shows a schematic diagram of the absolute value of the electric field strength profile of the laser optical mode of the device of FIG. 1 where the modulator is in a non-resonant state.

FIG. 2 illustrates the principles of the operation of the electronically wavelength tunable vertical cavity surface emitting laser of FIG. 1. FIG. 2(a) shows schematically the device of FIG. 1 in a simple form, showing only some of the elements. The elements shown include the substrate 101, the first distributed Bragg reflector 102, the first cavity 130 (which includes the active region 112 and the modulator 120), the second distributed Bragg reflector 151 and the third distributed Bragg reflector 152 combined, the filter 155, and the fourth distributed Bragg reflector 153.

FIG. 2(b) shows the spatial profile of the resonant optical mode of the device when the modulator is switched to the resonant state. FIG. 2(b) plots the absolute value of the electric field strength in the optical mode. In the resonant state, the laser generates the laser light at a wavelength, which corresponds to the resonant wavelength of the filter. Therefore the resonant optical mode of the laser is a coupled mode having high intensity in both the first cavity 130 and in the filter 155. Consequently, the light output power proportional to the field intensity in the air is high.

FIG. 2(c) shows the spatial profile of the resonant optical mode of the device when the modulator is switched to a non-resonant state. FIG. 2(c) plots the absolute value of the electric field strength in the optical mode. In any non-resonant state, the laser generates the laser light at a wavelength other than the resonant wavelength of the filter. Therefore the optical mode of the laser at the non-resonant wavelengths is a mode having a high intensity in the first cavity and a low intensity in the filter. Consequently, the light output power proportional to the field intensity in the air is low.

Alternating a bias voltage applied to the modulator switches the device between the resonant state and some selected non-resonant state. The output light power alternates between a high intensity and a low intensity accordingly.

Figure 3:
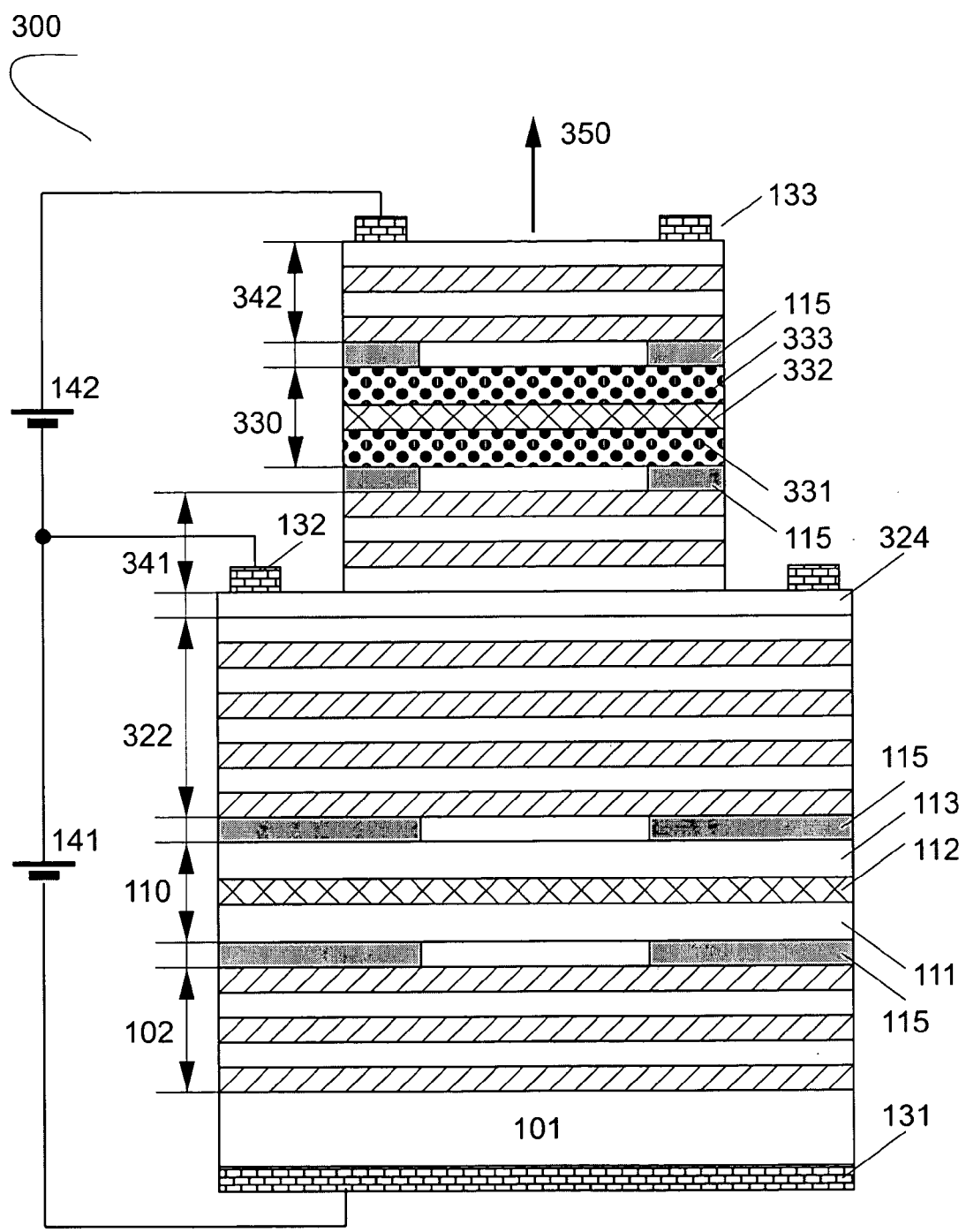
FIG. 3 shows a schematic diagram of an electronically wavelength tunable surface emitting laser including a light generating element and a filter element, where a modulator is placed in the filter element, according to another embodiment of the present invention.

FIG. 3 shows a schematic diagram of an electronically wavelength tunable vertical cavity surface emitting laser in another embodiment of the present invention. In this embodiment, the modulator is integrated with the filter element. By varying a voltage applied to a modulator, its refractive index changes. The filter then can come into resonance with the generated laser light, or go out of resonance with the generated laser light. Thus the device operates as an electronically wavelength tunable vertical cavity surface emitting laser providing output laser light modulated in intensity.

The device 300 includes a substrate 101, which is preferably n-doped, a first distributed Bragg reflector 102, which is preferably n-doped, a light generating element 110, a second distributed Bragg reflector 322, which is preferably p-doped, a current spreading p-doped layer 324, a third distributed Bragg reflector 341 which is preferably p-doped, a filter element 330, and a fourth distributed Bragg reflector 342, which is preferably n-doped. Current apertures 115 are preferably placed between the first distributed Bragg reflector 102 and the light generating element 110, between the light generating element 110, and the second distributed Bragg reflector 322, between the third distributed Bragg reflector 341 and the filter element 330, and between the filter element 330 and the fourth distributed Bragg reflector 342.

A forward bias 141 is applied to the light generating element 110 via the first contact (n-contact) 131 and the second contact (p-contact) 132. The p-contact 132 is mounted on a current spreading p-doped layer 324.

The filter element 330 includes a weakly p-doped or an undoped layer 331, a modulator region 332, and a weakly n-doped or an undoped layer 333. The modulator region 332 operates under a reverse bias 142 which is applied via the second contact (p-contact) 132 and the third contact (n-contact) 133. The modulator region preferably includes a single or multiple quantum wells, a single or multiple layers of quantum wires, a single or multiple layers of quantum dots, or any combination thereof. Under a reverse bias 142, an electric field applied to the modulator region causes a quantum confined Stark effect. The latter results in a shift of the spectral position of the optical absorption peak. Due to Kramers-Kronig relationship between the real and the imaginary parts of the dielectric functions, a change in the absorption spectrum is accompanied by a corresponding variation of the refractive index. The change in the refractive index of the modulator leads to a shift in the resonant wavelength of the filter element 330. Thus, by applying a different value of the reverse bias 142, it is possible to shift the resonant wavelength of the filter element. This allows the filter element 330 to be brought to resonance with the laser light generated by the light generating element, as well as permitting the filter element to be moved out of resonance. Laser light comes out 350 through the fourth distributed Bragg reflector 342.

The functionality of the devices of the present invention is based on electrooptical effects, namely on a change in the refractive index when an electric field is applied. If an electric field is applied perpendicularly to the layers, the conduction and the valence bands of the semiconductor device tilt due to the potential of the external field resulting in the shifting of the energy levels. This results in a smaller absorption energy, and the absorption edge shifts to longer wavelengths. The effect in bulk materials is known as the Franz-Keldysh effect (I. Galbraith, B. Ryvkin "Empirical determination of the electroabsorption coefficient in semiconductors", J. Appl. Phys. 74, 4145 (1993)). A change in the absorption coefficient $\Delta\alpha$ (electroabsorption) results also in a refractive index change $\Delta n$ (electrorefraction). The latter can be calculated by Kramers-Kronig transform, (see, e.g., D. S. Chelma et al. "Room Temperature Excitonic Nonlinear Absorption and Refraction in GaAs/AlGaAs Multiple Quantum Well Structures", IEEE Journal of Quantum Electronics, Vol. QE-20 (3), pp. 265-275 (1984)), $$\Delta n(\omega) = \frac{c}{\pi} P \int_0^\infty \frac{\Delta\alpha(\omega')}{\omega'^2 - \omega^2} d\omega'. \quad (2)$$

where the symbol P indicates that the principal value of the integral has to be evaluated, and c is the velocity of light.

The phenomenon in quantum confined structures like quantum wells, quantum wires or quantum dots is referred to as the Quantum Confined Stark Effect. In realistic electric fields, ranging from zero to a few hundred kV/cm, the electrorefraction is described as a sum of a linear eletrooptical effect (Pockel's effect) and a quadratic electrooptical effect (Kerr effect), (see, e.g. J. E. Zucker, T. L. Hendrickson, and C. A. Burrus, "Electro-optic phase modulation in GaAs/AlGaAs quantum well waveguides", Applied Physics Letters, Vol. 52 (12), pp. 945-947 (1988)).

$$\Delta n = \frac{1}{2} n_0^3 (rF + sF^2), \quad (3)$$

where F is the electric field strength, $n_0$ is the refractive index in the zero electric field, and r and s are the linear and quadratic electrooptical coefficients.

In GaAs/GaAlAs quantum well structures, the quadratic electrooptical effect dominates at electric fields of about 50 kV/cm (see J. S. Weiner et al., "Quadratic electro-optic effect due to the quantum-confined Stark effect in quantum wells", Applied Physics Letters, Vol. 50 (13), pp. 842-844 (1987) and J. E. Zucker et al. "Quaternary quantum wells for electro-optic intensity and phase modulation at 1.3 and 1.55 µm", Applied Physics Letters, Vol. 54 (1), pp. 10-12 (1989)). Furthermore, the quadratic electrooptical coefficient s in GaInAs/InP, GaInAsP/InP, and GaAs/GaAlAs quantum well structures is inversely proportional to the detuning $\Delta\omega$ between the exciton energy in the zero electric field and the photon energy below the bandgap, at which the refractive index is considered, $$\Delta n = \frac{\eta F^2}{\Delta\omega}. \quad (4)$$

Here $\eta$ is the so called figure of merit, which was estimated to be of the order of $3 \times 10^{-5}$ meV cm$^2$ kV$^{-2}$. The behavior (Eq. (4)) had initially been experimentally studied for quantum wells having a width between 6 and 10 nm, and detunings up to 40 meV. The electrooptical effect decreases at larger detuning (from 40 to 140 meV) much faster than given by Eq. (4) (see M. P. Earnshow and D. W. E. Allshop, "Electrooptic Effects in GaAs—AlGaAs Narrow Coupled Quantum Wells", IEEE Journal of Quantum Electronics, Vol. 37 (7), pp. 897-904; ibid. Vol. 37 (8), p. 1103 (2001)).

Although the exciton peak absorption decreases significantly upon applied electric field (see, e.g., L. Chen, K. C. Rajkumar, and A. Madhukar "Optical Absorption and Modulation Behavior of Strained InxGa1-xAs/GaAs (100) ($x \leq 0.25$) multiple quantum well structure grown via molecular beam epitaxy", Applied Physics Letters, Vol. 57 (23), pp. 2478-2480 (1990)), the exciton line width increases correspondingly. The integral excition absorption is proportional to the oscillator strength, which can also be roughly estimated to be proportional to the product of the peak absorption by the exciton line width, may either decrease much slower or even remain unchanged.

The exciton oscillator strength in a rather narrow quantum well remains unaffected by an applied electric field if the quantum well width is smaller than one half of the exciton Bohr radius (see Feng et al. "Exciton energies as a function of electric field: Confined quantum Stark effect", Physical Review B, Vol. 48 (3), pp. 1963-1966 (1993)). For InGaAs quantum wells in GaAs, this means quantum wells preferably 7 nm or thinner. The unaffected oscillator strength implies an unaffected integral excition absorption. Additionally, there is evidence of an increased electrooptical effect in narrow coupled quantum wells.

While selecting particular quantum wells for the modulator for the present invention, as well as particular values of the detuning and electric field, it is important to take into account electrooptical effects and their theroretical modeling, which are published in the references cited above. These references are hereby incorporated herein by reference.

In a different embodiment of the present invention, the modulator region operates under a forward bias. This causes the exciton bleaching effect that changes the optical absorption peak and thus affects the refractive index of the modulator.

Figure 4:
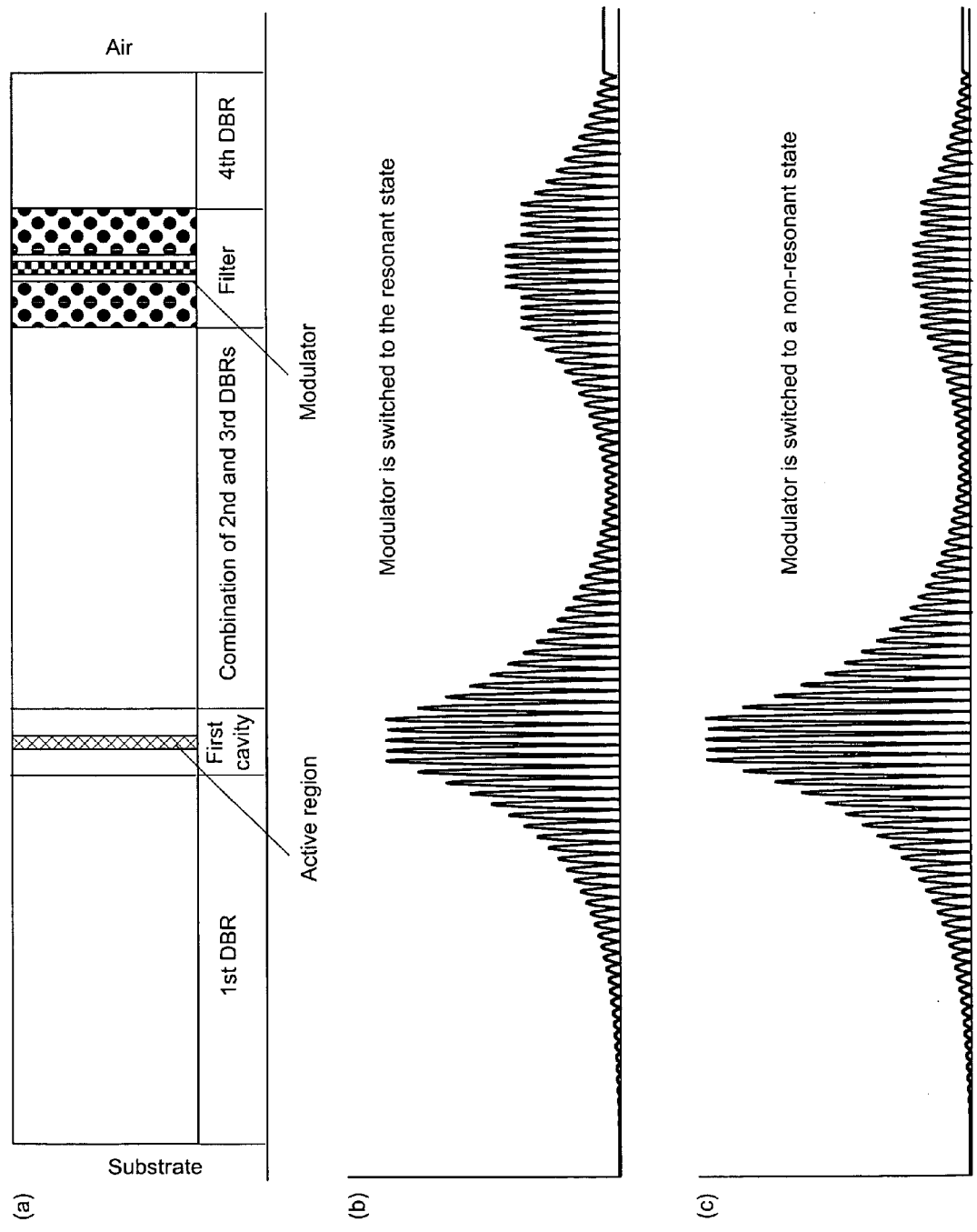
FIG. 4(a) shows a schematic diagram of the device of FIG. 3.
FIG. 4(b) shows a schematic diagram of the absolute value of the electric field strength profile of the laser optical mode of the device of FIG. 3 where the modulator is in the resonant state.
FIG. 4(c) shows a schematic diagram of the absolute value of the electric field strength profile of the laser optical mode of the device of FIG. 3 where the modulator is in a non-resonant state.

FIG. 4 illustrates the principles of the operation of the electronically wavelength tunable vertical cavity surface emitting laser of FIG. 3. FIG. 4(a) shows schematically the device of FIG. 3 in a simple form, showing only some of the elements. The elements shown include the substrate 101, the first distributed Bragg reflector 102, the first cavity (which includes the active region 112), the combination of the second distributed Bragg reflector 322 and the third distributed Bragg reflector 341, the filter 330 (which includes the modulator 332) and the fourth distributed Bragg reflector 342.

FIG. 4(b) shows the spatial profile of the resonant optical mode of the device when the modulator is switched to the resonant state. FIG. 4(b) plots the absolute value of the electric field strength in the optical mode. In the resonant state, the laser generates the laser light at a wavelength, which corresponds to the resonant wavelength of the filter. Therefore, the resonant optical mode of the laser is a coupled mode having high intensity in both the first cavity and in the filter. Consequently, the light output power proportional to the field intensity in the air is high.

FIG. 4(c) shows the spatial profile of the resonant optical mode of the device when the modulator is switched to a non-resonant state. FIG. 4(c) plots the absolute value of the electric field strength in the optical mode. In any non-resonant state, the laser generates the laser light at any wavelength that does not correspond to the resonant wavelength of the filter. Therefore, the optical mode of the laser is a mode having a high intensity in the first cavity and a low intensity in the filter. Consequently, the light output power proportional to the field intensity in the air is low.

By alternating a bias voltage applied to the modulator, one switches the device between the resonant state and some selected non-resonant state. The output light power alternates between a high intensity and a low intensity accordingly.

Figure 5:
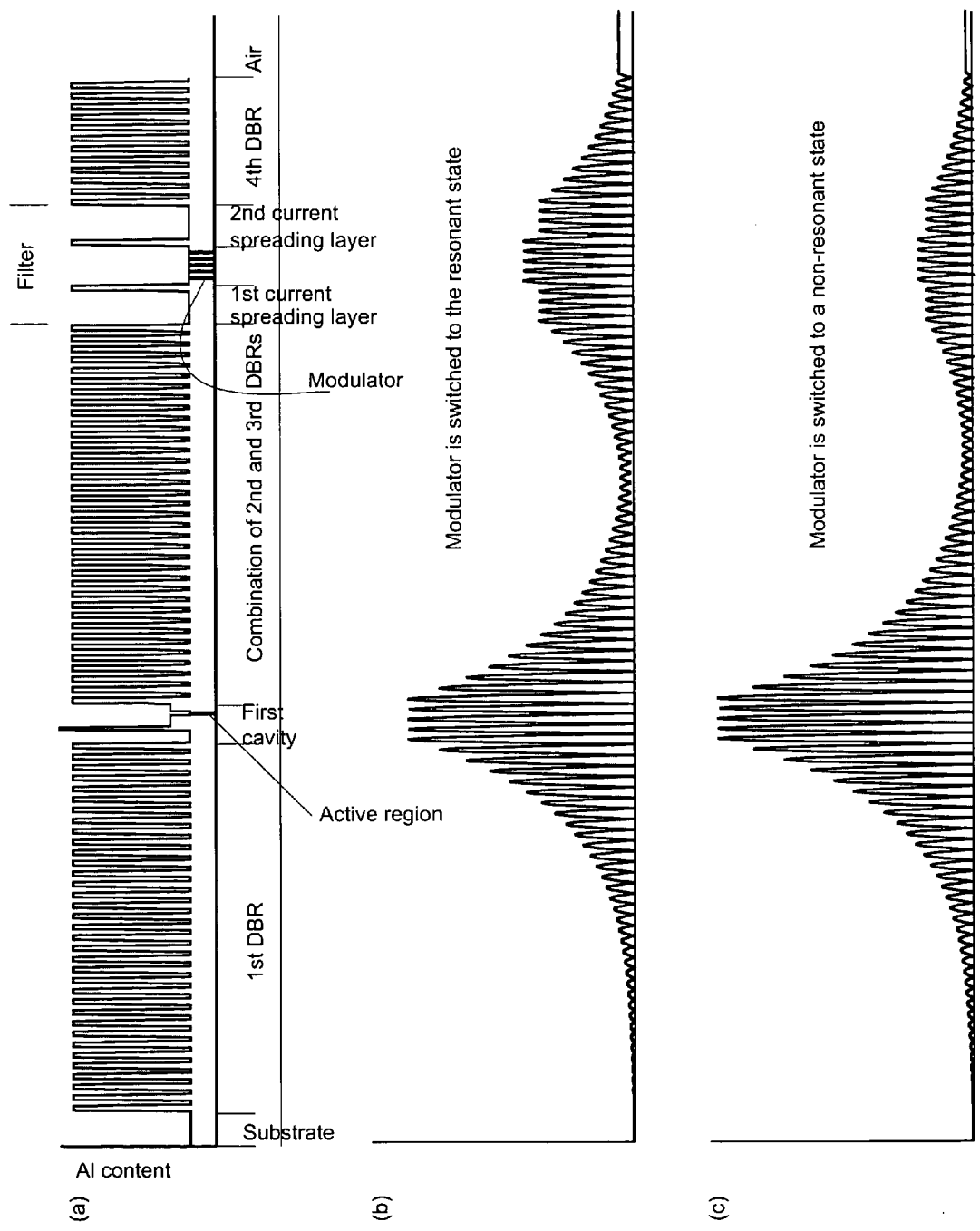
FIG. 5(a) shows a schematic profile of the aluminum composition of one particular embodiment of the device of FIG. 3.
FIG. 5(b) shows a schematic diagram of the absolute value of the electric field strength profile of the laser optical mode of the device of FIG. 5(a) where the modulator is in the resonant state.
FIG. 5(c) shows a schematic diagram of the absolute value of the electric field strength profile of the laser optical mode of the device of FIG. 5(a) where the modulator is in a non-resonant state.

FIG. 5 illustrates a particular example of the device of FIG. 4, realized on a GaAs/GaAlAs structure. FIG. 5(a) shows an aluminum composition profile further showing the basic elements of the device: the substrate, the first distributed Bragg reflector, the first cavity including the active region, the combination of the second distributed Bragg reflector and the third distributed Bragg reflector, the filter (including the modulator, the first current spreading layer and the second current spreading layer), and the fourth distributed Bragg reflector. FIG. 5(b) repeats basically FIG. 4(b) showing the optical mode profile, when the modulator is switched to the resonant state. FIG. 5(c) repeats basically FIG. 4(c) showing the optical mode profile, when the modulator is switched to a non-resonant state.

The second distributed Bragg reflector and the third distributed Bragg reflector in both the embodiments of FIG. 1 and of FIG. 3 can be in other terms described as a single distributed Bragg reflector, in the middle of which a current spreading layer is introduced, and upon which a contact is mounted.

Figure 6:
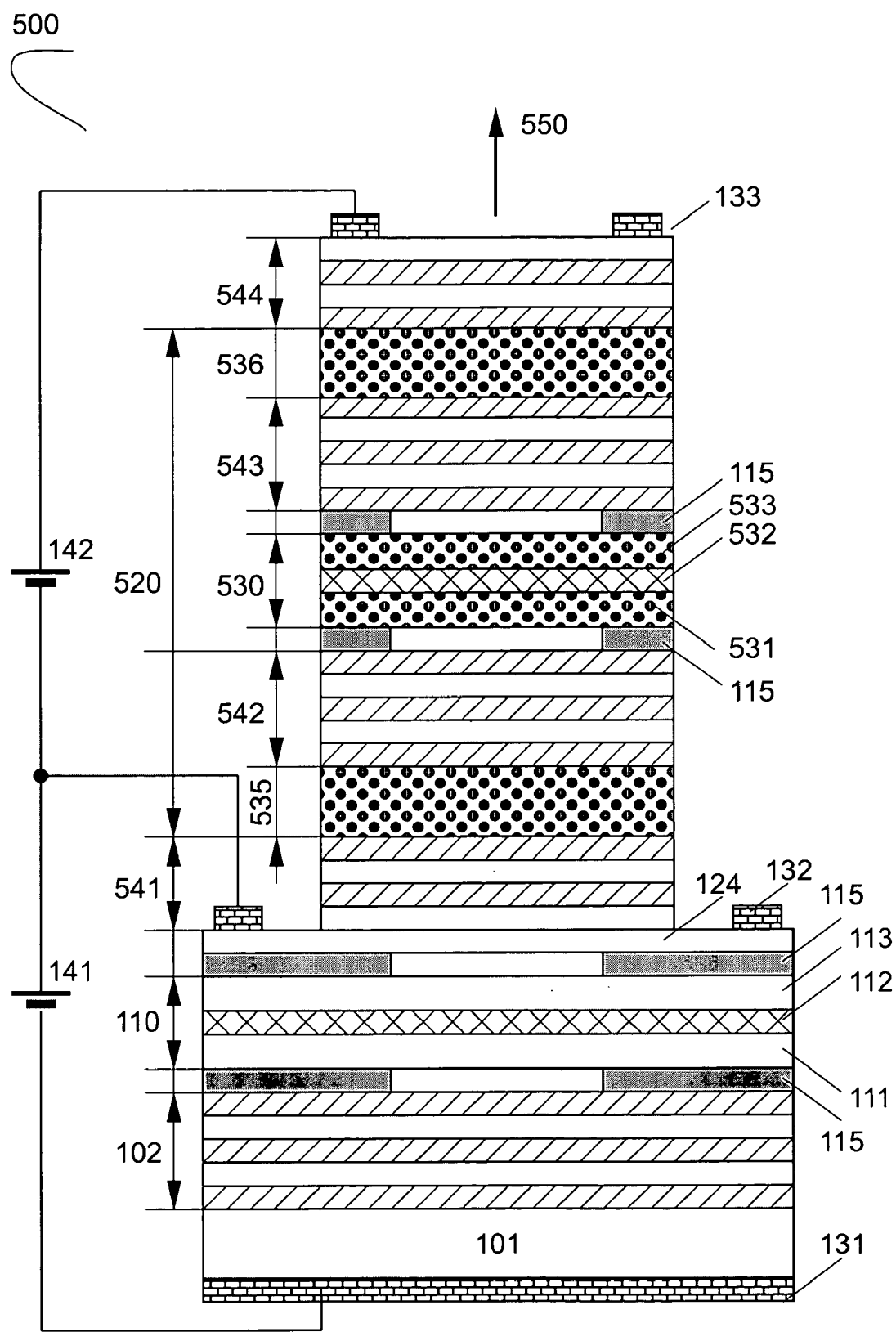
FIG. 6 shows a schematic diagram of an electronically wavelength tunable surface emitting laser including a light generating element and a filter element, where the filter element includes a plurality of cavities connected by distributed Bragg reflectors, and the modulator is placed within one of the cavities, according to another embodiment of the present invention.

FIG. 6 shows schematically an electronically wavelength-tunable vertical cavity surface emitting laser, in another embodiment of the present invention. The filter element includes multiple cavities, where single cavities are connected by distributed Bragg reflectors, and the modulator region is located within one cavity of the multiple-cavity filter. The device 500 includes a substrate 101, which is preferably n-doped, a first distributed Bragg reflector 102, which is preferably n-doped, a light generating element 110, a current spreading p-doped layer 124, a second distributed Bragg reflector 541, which is preferably p-doped, a filter element 520, and a third distributed Bragg reflector 544, which is preferably n-doped. The filter element 520 is a multiple cavity filter element. It includes multiple cavities connected by distributed Bragg reflectors. In the particular embodiment of FIG. 5, the filter element includes a first filter cavity 535, which is preferably p-doped, a fourth distributed Bragg reflector 542, a second filter cavity 530, into which a modulator element 532 is placed, a fifth distributed Bragg reflector 543, which is preferably n-doped, and a third filter cavity 536, which is preferably n-doped.

Single cavities composing the filter element 520 are resonant cavities that preferably have resonant transmission at different wavelengths. This enables the creation of a filter element, which has a high transmission coefficient in a certain, not necessarily narrow, spectral region. This spectral region may be controlled by a number of single cavities composing the filter element, by spectral positions of the resonance wavelengths of every single cavity, and by the strength of every distributed Bragg reflector.

The second filter cavity 530 includes a layer 531, which is preferably weakly p-doped, or undoped, a modulator region 532, and a layer 533, which is preferably weakly n-doped or undoped. Current apertures 115 are placed between the fourth distributed Bragg reflector 542 and the second filter cavity 530, and between the second filter cavity 530 and the fifth distributed Bragg reflector 543.

The modulator region 532 operates under a reverse bias 142 which is applied via the second contact (p-contact) 132 and the third contact (n-contact) 133. The modulator region includes a single or multiple quantum wells, a single or multiple layers of quantum wires, a single or multiple layers of quantum dots, or any combination thereof. Under a reverse bias 142, an electric field applied to the modulator region causes a quantum confined Stark effect. The latter results in a shift of the spectral position of the optical absorption peak. Due to Kramers-Kronig relationship between the real and the imaginary parts of the dielectric functions, a change in the absorption spectrum is accompanied by a corresponding variation of the refractive index. The change in the refractive index of the modulator leads to a shift in the resonant wavelength of the second filter cavity 530 within the filter element 520. Thus, by applying a different value of the reverse bias 142, it is possible to shift the resonant wavelength of the second filter cavity 530 within the filter element. The filter element 520 may be optimized such that shifting the resonant wavelength of one cavity may drive the whole filter element into resonance or out of resonance with the generated laser light. Laser light comes out 550 through the third distributed Bragg reflector 544.

In another embodiment of the present invention, a modulator region, placed into one of the cavities of the multiple cavity filter element, operates under a forward bias. This causes an exciton bleaching effect that changes the optical absorption peak and thus affects the refractive index of the modulator.

Figure 7:
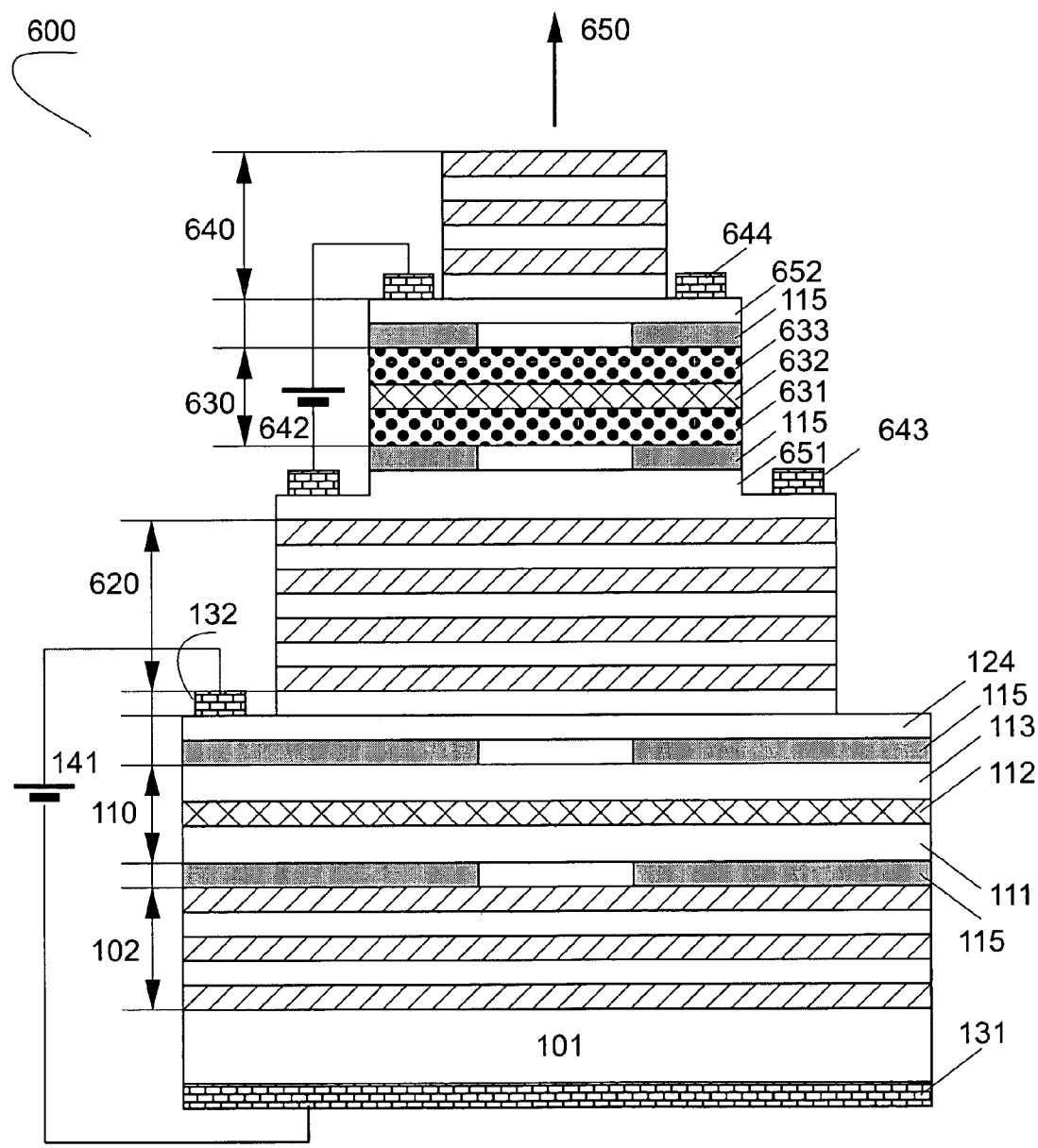
FIG. 7 shows a schematic diagram of an electronically wavelength tunable surface emitting laser including a light generating element and a filter element, where the modulator is placed within the filter element, and the bias is supplied to the filter element via two intracavity contacts.

FIG. 7 shows a schematic diagram of an electronically wavelength-tunable vertical cavity surface emitting laser according to yet another embodiment of the present invention. In a device 600, a circuit through which a forward bias is applied to a light generating element is electrically decoupled from a circuit, through which a reverse bias is applied to a modulator region. The device 600 includes a substrate 101, which is preferably n-doped, a first distributed Bragg reflector 102, which is preferably n-doped, a light generating element 110, a first current spreading p-layer 124, a second distributed Bragg reflector 620, which is preferably undoped, a second current spreading p-layer 651, a filter element 630, into which a modulator region is introduced, a first current spreading n-layer 652, and a third distributed Bragg reflector 640, which is preferably undoped. The filter element 630 includes a weakly p-doped or an undoped layer 631, a modulator region 632, and a weakly n-doped or undoped layer 633. A reverse bias 642 is applied to the modulator region 632 via the p-contact 643 and the n-contact 644. Current apertures 115 are introduced between the second current spreading p-layer 651 and the filter element 630 and between the filter element 630 and the current spreading n-layer 652. Laser light 650 comes out through the third distributed Bragg reflector 640.

Figure 8:
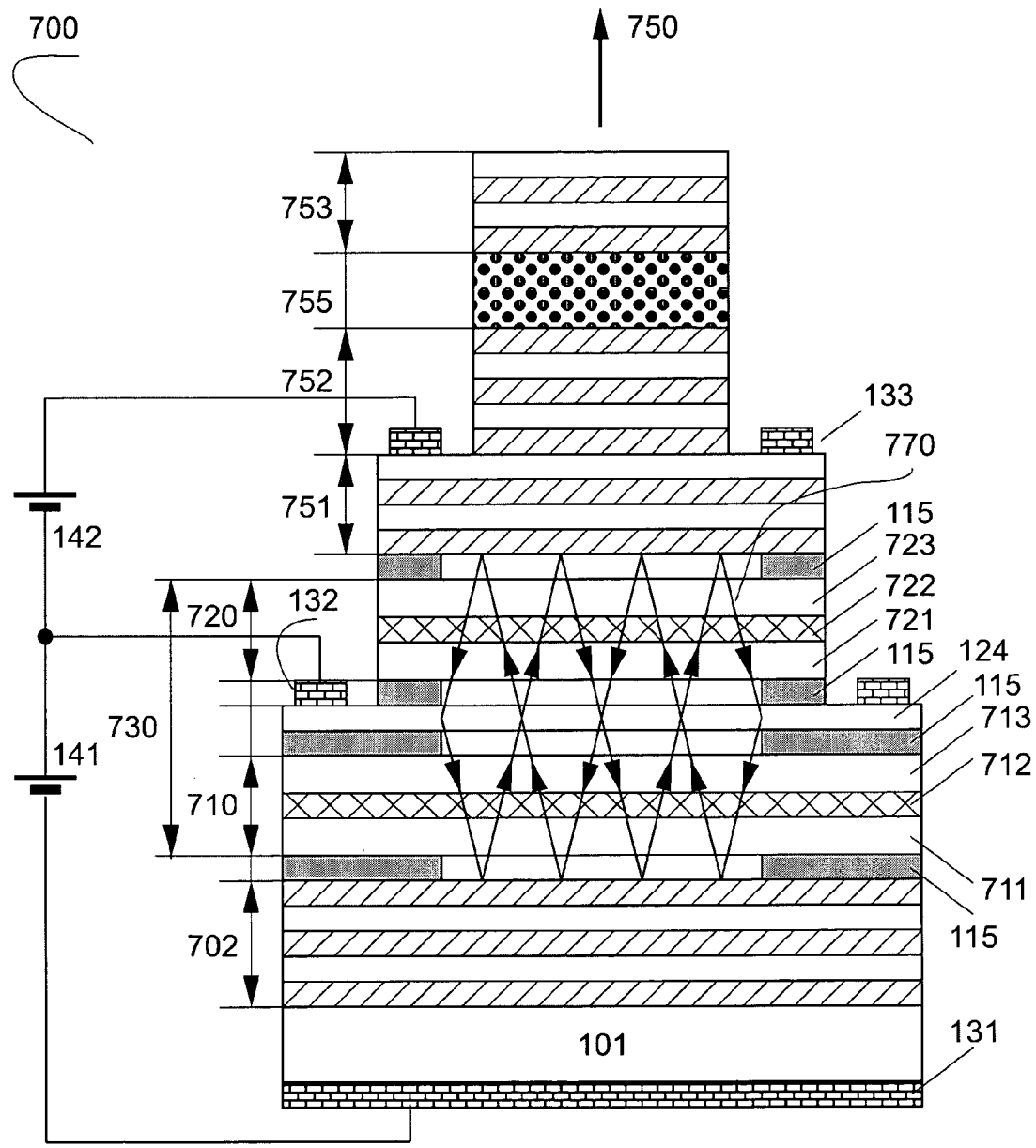
FIG. 8 shows a schematic diagram of an electronically wavelength tunable tilted cavity laser including a light generating element and a filter element, where the modulator is placed within the light generating element.

FIG. 8 shows an electronically wavelength-tunable tilted cavity laser 700. The concept of a tilted cavity laser was disclosed by N. N. Ledentsov et al. in "TILTED CAVITY SEMICONDUCTOR LASER AND METHOD OF MAKING SAME", U.S. Patent Publication No. 2003/0152120, published Aug. 14, 2003, herein incorporated by reference. A tilted cavity laser includes a cavity and at least one multilayer interference reflector (MIR), where the cavity and the multilayer interference reflector are selected such that the optical mode, having the minimum leakage losses to the substrate and the contact layers is an optical mode, in which the light within the cavity propagates in a direction tilted with respect to both the p-n junction plane and the direction normal to the p-n junction plane.

The tilted cavity laser 700 includes a substrate 101, which is preferably n-doped, a first MIR 702, which is preferably n-doped, a tilted cavity 730, a second MIR 751, which is preferably n-doped, a third MIR 752, which is preferably undoped, a filter element 755, which is preferably undoped, and a fourth MIR 753, which is preferably undoped. The tilted cavity 730 also includes a light generating element 710, a current spreading p-layer 124, and a modulator element 720. The light generating element 710 includes a weakly n-doped or an undoped layer 711, an active region 712, and a weakly p-doped or undoped region 713. The active region 712 is formed of any insertion or combinations of insertions, including a double heterostructure, a quantum well, an array of quantum wires, arrays of quantum dots, or any combination thereof. The active region 712 generates light when a forward bias 141 is applied. The bias is applied via the first contact (n-contact) 131 mounted on the bottom side of the substrate 101 and the second contact (p-contact) 132 mounted on the current spreading p-layer 124. Current apertures 115 are placed between the first MIR 702 and the light generating element 710 and between the light generating element 702 and the current spreading p-layer 124. The modulator element 720 includes a weakly p-doped or an undoped layer 721, a modulator region 722, and a weakly n-doped or an undoped region 723.

The modulator region 722 includes one or multiple quantum wells, one or multiple layers of quantum wires or quantum dots, or any combination thereof. In the particular embodiment of FIG. 8, the modulator 722 operates when a reverse bias 142 is applied. The operation of the modulator is based on the quantum confined Stark effect. By varying the bias 142, the electric field applied to the modulator is varied. The position of the optical absorption peak is shifted, due to the Stark effect. Due to Kramers-Kronig relationship between the real and imaginary parts of the dielectric function of the medium, the shift of the absorption peak results in a modulation of the refractive index of the modulator. The latter leads to a shift of the resonant wavelength of the cavity 730, and thus, to a shift of the wavelength of the generated laser light.

The reverse bias 142 is applied to the modulator via the second contact 132 (p-contact) and the third contact 133 (n-contact).

The tilted cavity 730, the first MIR 702, and the second MIR 751 are selected such that, among various optical modes, a mode having the minimum leaky losses to the substrate and the contacts is a tilted optical mode 770, in which light within the cavity propagates in a direction tilted with respect to both the p-n junction plane and to the direction normal to the p-n junction plane. Light of the tilted optical mode 770 propagates through the second MIR 751, the third MIR 752, the filter region 755, and the fourth MIR 753.

The filter element 755 is formed such that it has a narrow spectral band of high transmission, whereas its transmission outside this narrow spectral region is low. As an example, the filter 755 is preferably formed by a resonant cavity sandwiched between two MIRs. Laser light comes out 750 through the fourth MIR 753.

In another embodiment of the present invention, the modulator region operates under a forward bias. Applying a forward bias results in an exciton bleaching effect, which further leads to a change in the refractive index of the modulator region.

In yet another embodiment of the present invention, an electronically wavelength-tunable tilted cavity laser has a modulator region placed within a filter element.

In another embodiment of the present invention, an electronically wavelength-tunable tilted cavity laser has a filter region composed of a few cavities connected by MIRs, where a modulator region is placed within one of the cavities.

Another embodiment includes an electronically tunable vertical cavity light-emitting diode, where the output optical power is switched between a low (or a zero) and a high power by varying the bias voltage applied to a modulator region.

Yet another embodiment includes an electronically tunable tilted cavity light emitting diode, where the output optical power is switched between a low (or a zero) and a high power by varying the bias voltage applied to a modulator region.

In another embodiment of the present invention, the device is a multi-section edge-emitting laser. In yet another embodiment of the present invention, the device is a multi-section distributed feedback laser.

Figure 9:
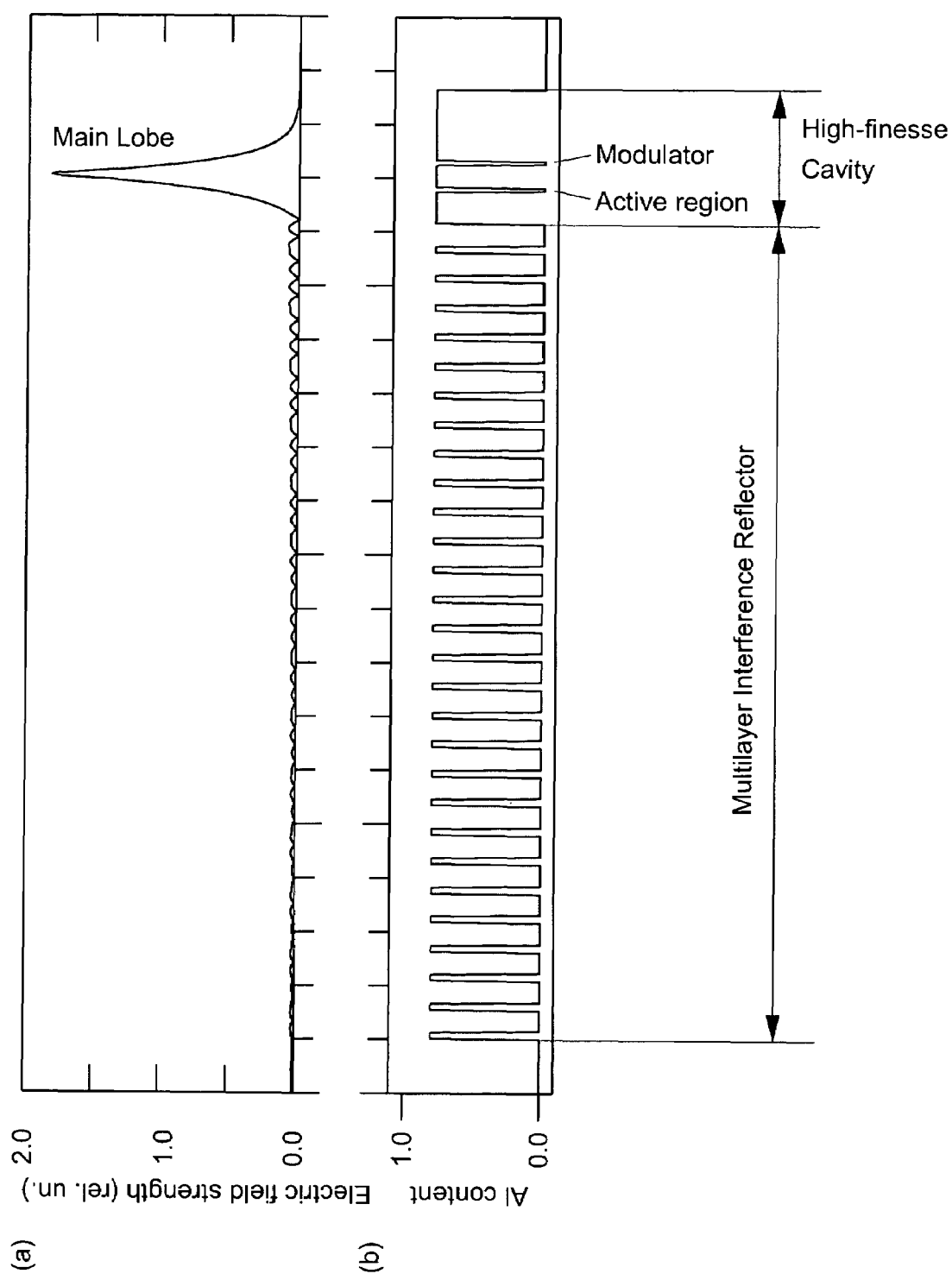
FIG. 9(a) shows the electric field strength profile in the resonant optical mode of a monolithic device including a tilted cavity laser and a modulator in the state where the electric field strength in the high-finesse cavity has a high value.
FIG. 9(b) shows the aluminum content of the device of FIG. 9(a).
Figure 10:
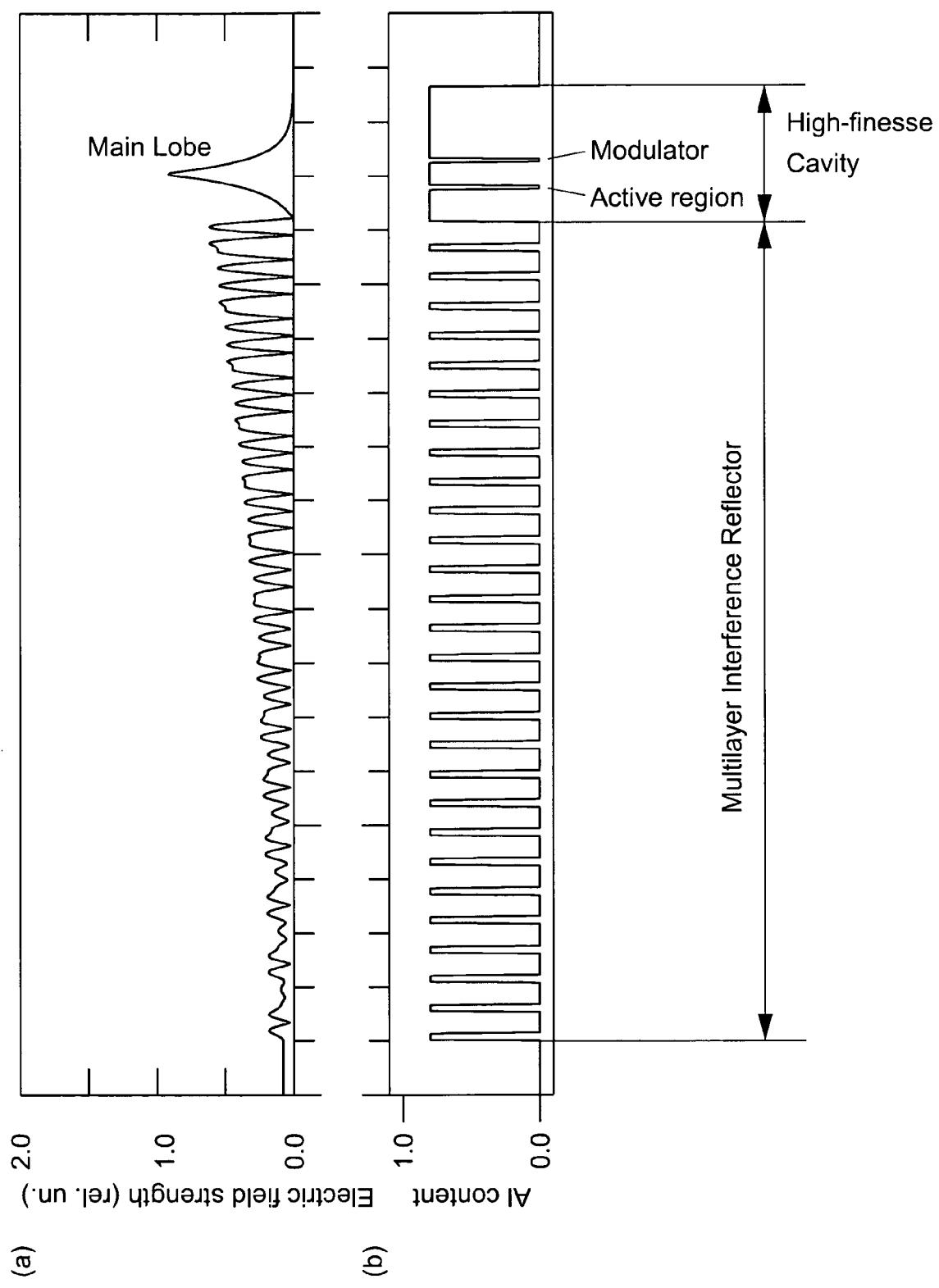
FIG. 10(a) shows the electric field strength profile in the resonant optical mode of a monolithic device including a tilted cavity laser and a modulator in the state where the electric field strength in the high-finesse cavity has a low value.
FIG. 10(b) shows the aluminum content of the device of FIG. 10(a).

FIGS. 9 and 10 show another embodiment of the present invention. This embodiment includes a tilted cavity optoelectronic device, as disclosed in earlier patent applications by the inventors of the present invention: U.S. patent Publication 2003/0152120, entitled "TILTED CAVITY SEMICONDUCTOR LASER (TCSL) AND METHOD OF MAKING SAME", published Aug. 14, 2003, and U.S. Patent Publication 2005/0040410, entitled "TILTED CAVITY SEMICONDUCTOR OPTOELECTRONIC DEVICE AND METHOD OF MAKING SAME", published Feb. 24, 2005. These applications are hereby herein incorporated by reference. The device is preferably a tilted cavity laser or a tilted cavity light-emitting diode. The device includes a multilayer interference reflector and a high-finesse cavity.

The wavelength of the cavity mode as a function of the angle of propagation follows a first dispersion law. The wavelength of the maximum reflectivity of the multilayer interference reflector (MIR) as the function of the propagation angle follows a second dispersion law. The two dispersion laws match at one propagation angle and at one wavelength. The cavity optical mode at this wavelength has a low leakage loss through the MIR, whereas the cavity mode at a different wavelength has a high leakage loss.

The spatial profile of the optical mode typically has a single lobe within the high finesse cavity and exhibits an oscillatory behavior within the MIR. The cavity and the MIR are selected such that the oscillatory part of the optical mode can not come out of the device as the light impinges at the facet effectively at an angle exceeding the angle of the total internal reflectance at the semiconductor/air interface. The light originating from the main lobe of the optical mode can come out of the device.

In the present invention, the active region and the modulator are preferably placed within the high-finesse cavity. The device has at least three contacts, such that the active region and the modulator can be independently biased similarly to the devices shown in the embodiments of FIGS. 1 and 3. For simplicity, the structure of the device is illustrated in FIG. 9(b) with an aluminum composition profile for a GaAlAs/GaAs—based device. In one state of the modulator, it has a refractive index such that the resonant optical mode of the device has a high intensity in the main lobe (FIG. 9(a)). In this state, light comes out with a high intensity. In another state of the modulator, it has a refractive index such that the electric field intensity in the resonant optical mode of the device is redistributed. The intensity of the optical mode intensity in the MIR is increased whereas it is decreased in the high-finesse cavity. Correspondingly, the electric field intensity in the main lobe is reduced in FIG. 10(a) with respect to FIG. 9(a). In this state, light comes out with a low intensity. By switching the modulator between the two states, it is possible to modulate the intensity of the outgoing light.

In some embodiments, the layers of the semiconductor device are preferably formed of materials including, but not limited to, GaN, AlN, InN, and any alloys made from these materials. In these embodiments, the n-doped layers are preferably formed by using a doping impurity, which includes, but is not limited to, Si or Sn, where the technology is selected such that these impurities are preferably incorporated into the cation sublattice. The p-doped layers are preferably formed by using p-doping impurities, which include, but are not limited to, Be and Mg.

In some other embodiments, the layers of the semiconductor device are preferably formed of materials including, but not limited to, GaAs and GaAlAs alloys.

Certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A semiconductor optoelectronic device comprising:
   a) at least two resonant cavities comprising a first resonant cavity and a second resonant cavity;
   b) at least one modulator region which electrooptically tunes a resonant wavelength of the second cavity with respect to a resonant wavelength of the first cavity;
   c) at least one light generating element comprising a gain region, which generates light when a forward bias is applied to the gain region; and
   d) at least three electric contacts which apply bias to the modulator region and to the light generating element independently;
   wherein tuning varies an optical transmittance of the device, such that an output optical power is varied; and
   wherein the modulator region tunes the resonant wavelength of the second cavity using an effect selected from the group consisting of:
      i) a quantum confined Stark effect by applying a reverse bias to tune a resonant component of a refractive index of the modulator region; and
      ii) an exciton bleaching effect by injection of nonequilibrium carriers by applying a forward bias;
   wherein the device modulates a transmittance of light through a filter comprising at least two coupled cavities by modulating a resonance of at least one of the coupled cavities.

2. The semiconductor optoelectronic device of claim 1, wherein the light generating element and the modulator region are located within the second cavity.

3. The semiconductor optoelectronic device of claim 2, wherein a population inversion is realized in the gain region, and the overall losses are low compared to gain to enable lasing.

4. The semiconductor optoelectronic device of claim 3, wherein the device is selected from the group consisting of:
   a) a vertical cavity surface emitting laser;
   b) a tilted cavity laser;
   c) a multi-section edge-emitting tilted cavity laser; and
   d) a multi-section distributed feedback tilted cavity laser.

5. The semiconductor optoelectronic device of claim 2, wherein a modulation of a refractive index of the modulator region changes the resonant wavelength of the second cavity with respect to the resonant wavelength of the first cavity, such that the output optical power is modulated.

6. The semiconductor optoelectronic device of claim 1, wherein the light generating element is placed in the first cavity and the modulator region is placed in the second cavity;
   wherein a modulation of a refractive index of the modulator region changes the resonant wavelength of the second cavity with respect to the resonant wavelength of the first cavity, such that the optical output power is modulated.

7. The semiconductor optoelectronic device of claim 6, wherein a population inversion is realized in the gain region, and the overall losses are low compared to gain to enable lasing.

8. The semiconductor optoelectronic device of claim 7, wherein the device is selected from the group consisting of:
   a) a vertical cavity surface emitting laser;
   b) a tilted cavity laser;
   c) a multi-section edge-emitting tilted cavity laser; and
   d) a multi-section distributed feedback tilted cavity laser.

9. The semiconductor optoelectronic device of claim 1, wherein the device is selected from the group consisting of:
 a) a vertical coupled-cavity waveguide;
 b) a tilted cavity waveguide;
 c) a multi-section planar waveguide; and
 d) a multi-section distributed feedback planar waveguide.

10. The semiconductor optoelectronic device of claim 9, further comprising at least a first section and a second section;
 wherein the gain region is placed within the first section comprising the resonant cavities; and wherein the device operates as a device selected from the group consisting of:
 a) a wavelength-tunable semiconductor optical amplifier;
 b) a lock-in optical amplifier; and
 c) a frequency-convertor for incoming light.

11. The semiconductor optoelectronic device of claim 1, wherein at least one element of the device is formed of materials selected from the group consisting of:
 i) III-V semiconductor materials; and
 ii) alloys based on III-V semiconductor materials;
 wherein the III-V semiconductor materials are selected from the group of binary compounds of an element A, selected from the group consisting of Al, Ga, and In; and an element B, selected from the group consisting of N, P, As, and Sb.

12. The semiconductor optoelectronic device of claim 11, wherein at least one element of the structure is formed of materials selected from the group consisting of:
 a) AlN;
 b) GaN;
 c) InN;
 d) alloys of AlN, GaN, and InN.

13. The semiconductor optoelectronic device of claim 1, wherein the device comprises one light generating element and one modulator region, wherein the light generating element and the modulator region are located within the second cavity.

14. A semiconductor optoelectronic device comprising:
 a) at least two resonant cavities comprising a first resonant cavity and a second resonant cavity;
 b) at least one modulator region which electrooptically tunes a resonant wavelength of the second cavity with respect to a resonant wavelength of the first cavity;
 c) at least one light generating element comprising a gain region, which generates light when a forward bias is applied to the gain region; and
 d) at least three electric contacts which apply bias to the modulator region and to the light generating element independently;
 wherein tuning varies an optical transmittance of the device, such that an output optical power is varied; and
 wherein the modulator region tunes the resonant wavelength of the second cavity using an effect selected from the group consisting of:
 i) a quantum confined Stark effect by applying a reverse bias to tune a resonant component of a refractive index of the modulator region; and
 ii) an exciton bleaching effect by injection of nonequilibrium carriers by applying a forward bias;
 wherein at least one of the resonant cavities operates as a filter element having a spectral band of high transmission;
 wherein when the optoelectronic device is in a resonant state, the optoelectronic device generates light at a first wavelength, which corresponds to a resonant wavelength of the filter element; and
 wherein, when the optoelectronic device is in a non-resonant state, the optoelectronic device generates laser light at a second wavelength, which is a wavelength other than the resonant wavelength of the filter element.

15. The semiconductor optoelectronic device of claim 14, further comprising a modulator located within the modulator region, wherein the modulator controls a wavelength of laser light such that, when the wavelength of laser light is out of resonance with the spectral band of the filter element, a first intensity of outgoing laser light is low, and when the wavelength of laser light is in resonance with the spectral band of the filter element, a second intensity of outgoing laser light is high.

16. The semiconductor optoelectronic device of claim 14, wherein at least one element of the device is formed of materials selected from the group consisting of:
 i) III-V semiconductor materials; and
 ii) alloys based on III-V semiconductor materials;
 wherein the III-V semiconductor materials are selected from the group of binary compounds of an element A, selected from the group consisting of Al, Ga, and In; and an element B, selected from the group consisting of N, P, As, and Sb.

17. A method of controlling an intensity of laser light leaving a semiconductor optoelectronic device comprising a first resonant cavity and a second resonant cavity; at least one modulator region; at least one light generating element comprising a gain region, which generates light when a forward bias is applied to the gain region; and at least three electric contacts, comprising the steps of:
 a) applying a bias to the modulator region and to the light generating element independently with the electric contacts;
 b) electrooptically tuning a resonant wavelength of the second cavity with respect to a resonant wavelength of the first cavity using the modulator region;
 c) tuning the resonant wavelength of the second cavity using the modulator region and an effect selected from the group consisting of:
 i) a quantum confined Stark effect by applying a reverse bias to tune a resonant component of a refractive index of the modulator region; and
 ii) an exciton bleaching effect by injection of nonequilibrium carriers by applying a forward bias;
 d) varying an optical transmittance of the device, such that an output optical power is varied; and
 operating at least one of the resonant cavities as a filter element having a spectral band of high transmission;
 wherein when the optoelectronic device is in a resonant state, the optoelectronic device generates light at a first wavelength, which corresponds to a resonant wavelength of the filter element; and
 wherein, when the optoelectronic device is in a non-resonant state, the optoelectronic device generates laser light at a second wavelength, which is a wavelength other than the resonant wavelength of the filter element.

18. The method of claim 17, wherein the light generating element and the modulator region are located within the second cavity.

19. The method of claim 17, further comprising the step of changing the resonant wavelength of the second cavity with respect to the resonant wavelength of the first cavity by modulating a refractive index of the modulator region, such that the output optical power is modulated.

20. A method of controlling an intensity of laser light leaving a semiconductor optoelectronic device comprising a first resonant cavity and a second resonant cavity; at least one modulator region; at least one light generating element comprising a gain region, which generates light when a forward bias is applied to the gain region; and at least three electric contacts, comprising the steps of:

a) applying a bias to the modulator region and to the light generating element independently with the electric contacts;

b) electrooptically tuning a resonant wavelength of the second cavity with respect to a resonant wavelength of the first cavity using the modulator region;

c) tuning the resonant wavelength of the second cavity using the modulator region and an effect selected from the group consisting of:

i) a quantum confined Stark effect by applying a reverse bias to tune a resonant component of a refractive index of the modulator region; and ii) an exciton bleaching effect by injection of nonequilibrium carriers by applying a forward bias;

d) varying an optical transmittance of the device, such that an output optical power is varied;

wherein the device modulates a transmittance of light through a filter comprising at least two coupled cavities by modulating a resonance of at least one of the coupled cavities.

\* \* \* \* \*

UNITED STATES PATENT AND TRADEMARK OFFICE
CERTIFICATE OF CORRECTION

PATENT NO. : 7,369,583 B2  Page 1 of 1
APPLICATION NO. : 11/144482
DATED : May 6, 2008
INVENTOR(S) : Ledentsov et al.

It is certified that error appears in the above-identified patent and that said Letters Patent is hereby corrected as shown below:

On the Title Page, Item (57)

Abstract

Line 4, replace the word "elecrooptically" with the word --electrooptically--

Column 4

Line 38, replace the word "elecrooptically" with the word --electrooptically--

Signed and Sealed this

Twenty-second Day of July, 2008

JON W. DUDAS
*Director of the United States Patent and Trademark Office*